(12) United States Patent
Tour et al.

(10) Patent No.: US 9,385,163 B2
(45) Date of Patent: Jul. 5, 2016

(54) ADDRESSABLE SIOX MEMORY ARRAY WITH INCORPORATED DIODES

(75) Inventors: James M. Tour, Bellaire, TX (US); Jun Yao, Allston, MA (US); Jian Lin, Houston, TX (US); Gunuk Wang, Houston, TX (US); Krishna Palem, Houston, TX (US)

(73) Assignees: WILLIAM MARSH RICE UNIVERSITY, Houston, TX (US); NANYANG TECHNOLOGICAL UNIVERSITY, Singapore (SG)

( * ) Notice: Subject to any disclaimer, the term of this patent is extended or adjusted under 35 U.S.C. 154(b) by 24 days.

(21) Appl. No.: 14/240,973

(22) PCT Filed: Aug. 27, 2012

(86) PCT No.: PCT/US2012/052450
§ 371 (c)(1),
(2), (4) Date: Aug. 11, 2014

(87) PCT Pub. No.: WO2013/032983
PCT Pub. Date: Mar. 7, 2013

(65) Prior Publication Data
US 2015/0162381 A1   Jun. 11, 2015

Related U.S. Application Data

(60) Provisional application No. 61/527,847, filed on Aug. 26, 2011.

(51) Int. Cl.
| H01L 45/02 | (2006.01) |
| H01L 27/24 | (2006.01) |
| H01L 45/00 | (2006.01) |
| H01L 29/66 | (2006.01) |
| H01L 29/861 | (2006.01) |
| H01L 29/872 | (2006.01) |

(52) U.S. Cl.
CPC ........ *H01L 27/2463* (2013.01); *H01L 27/2409* (2013.01); *H01L 29/66136* (2013.01);
(Continued)

(58) Field of Classification Search
CPC . H01L 27/2409; H01L 27/2463; H01L 45/08; H01L 45/1233; H01L 45/145
See application file for complete search history.

(56) References Cited

U.S. PATENT DOCUMENTS

| 8,390,326 B2 | 3/2013 | Or-bach et al. |
| 8,592,791 B2 | 11/2013 | Tour et al. |

(Continued)

FOREIGN PATENT DOCUMENTS

WO   WO2012/071100 A1   5/2012

OTHER PUBLICATIONS

Sawa, Resistive switching in transition metal oxides, Jun. 2008 [Retrieved from http://www.sciencedirect.com/science/article/pii/S1369702108701196].

(Continued)

*Primary Examiner* — Mark Prenty
(74) *Attorney, Agent, or Firm* — Winstead PC

(57) ABSTRACT

Various embodiments of the resistive memory cells and arrays discussed herein comprise: (1) a first electrode; (2) a second electrode; (3) resistive memory material; and (4) a diode. The resistive memory material is selected from the group consisting of $SiO_x$, $SiO_xH$, $SiO_xN_y$, $SiO_xN_yH$, $SiO_xC_z$, $SiO_xC_zH$, and combinations thereof, wherein each of x, y and z are equal to or greater than 1 and equal to or less than 2. The diode may be any suitable diode, such as n-p diodes, p-n diodes, and Schottky diodes.

21 Claims, 14 Drawing Sheets

(52) U.S. Cl.
CPC .......... *H01L29/66143* (2013.01); *H01L 45/04* (2013.01); *H01L 45/1233* (2013.01); *H01L 45/1253* (2013.01); *H01L 45/145* (2013.01); *H01L 45/1608* (2013.01); *H01L 45/1616* (2013.01); *H01L 45/1625* (2013.01); *H01L 45/1675* (2013.01); *H01L 29/8611* (2013.01); *H01L 29/8613* (2013.01); *H01L 29/872* (2013.01)

(56) References Cited

U.S. PATENT DOCUMENTS

| | | | |
|---|---|---|---|
| 9,203,021 B2* | 12/2015 | Sonehara | H01L 45/1253 |
| 2007/0159868 A1 | 7/2007 | Sugita et al. | |
| 2010/0155722 A1 | 6/2010 | Meyer | |
| 2010/0157657 A1 | 6/2010 | Rinerson et al. | |
| 2010/0207095 A1 | 8/2010 | Lai et al. | |
| 2010/0219498 A1 | 9/2010 | Shimizu | |
| 2011/0038196 A1* | 2/2011 | Tour et al. | 365/148 |

OTHER PUBLICATIONS

J. Yao, Z. Sun, L. Zhong, D. Natelson, and J. M. Tour, "Resistive switches and memories from silicon oxide", Nano Lett. 10, 4105-4110 (2010).

M. Dong and L. Zhong, "Challenges to crossbar integration of nanoscale two-terminal symmetric memory devices," in Proc. IEEE Int. Conf. Nanotechnology, (2008).

J. Yao, L. Zhong, D. Natelson, and J. M. Tour, "Etching-dependent reproducible memory switching in vertical SiO2 structures", Appl. Phys. Lett. 93, 253101 (2008).

J. Yao, L. Zhong, Z. Zhang, T. He. Z. Jin, D. Natelson, and J. M. Tour, "Resistive switching in nanogap systems on SiO2 substrates", Small, 5, 2910-2915 (2009).

J. Yao, L. Zhong, D. Natelson, and J. M. Tour, "Making memory out of silicon oxide filaments", EE Times Europe, Dec. 2010, p. 11.

J. Yao, L. Zhong, D. Natelson, and J. M. Tour, "Intrinsic resistive switching and memory effects in silicon oxide", Appl. Phys. A 102, 835-839 (2011).

E. Linn, et al. "Complementary resistive switches for passive nanocrossbar memories", Nat. Mat. 9, 403-406 (2010).

M. J. Lee et al., "Low-Temperature-Grown Transition Metal Oxide Based Storage Materials . . . ", Advanced Functional Materials 2009, 19, 1587-1593.

M. J. Lee et al., "A Low-Temperature-Grown Oxide Diode as a New Switch Element for High-Density, Nonvolatile Memories", Advanced Materials 2007, 19, 73-76.

International Search Report for PCT/US2012/052450, mailed Nov. 2, 2012.

International Preliminary Report on Patentability for PCT/US2012/052450, mailed Mar. 4, 2014.

* cited by examiner

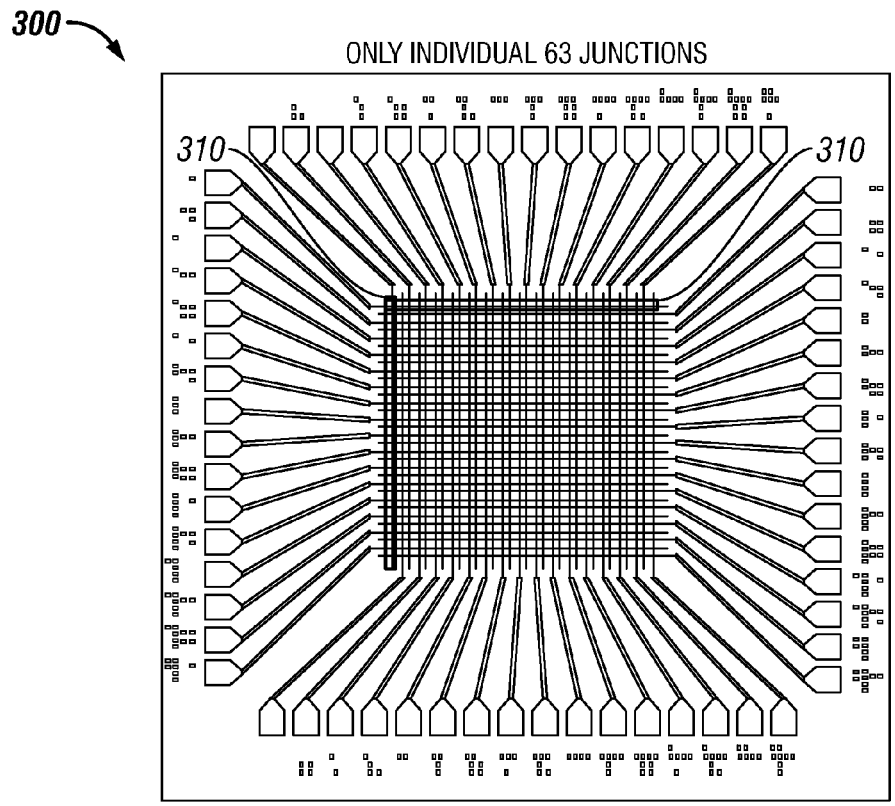
FIG. 3
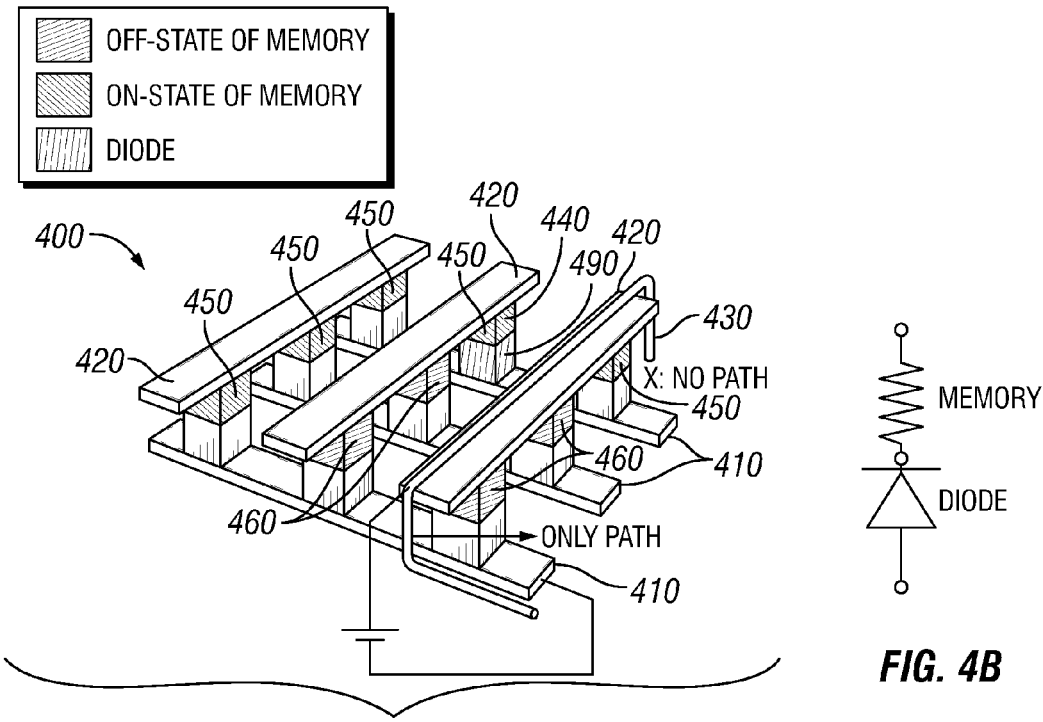
FIG. 4A
FIG. 4B

ADDRESSABLE SIOX MEMORY ARRAY WITH INCORPORATED DIODES

CROSS-REFERENCE TO RELATED APPLICATIONS

This application claims priority to U.S. Provisional Patent Application No. 61/527,847, filed on Aug. 26, 2011, the entirety of which is incorporated herein by reference.

STATEMENT REGARDING FEDERALLY SPONSORED RESEARCH

This invention was made with government support under Grant No. NNX11CH49P, awarded by the National Aeronautics and Space Administration. The government has certain rights in the invention.

FIELD OF THE INVENTION

This invention relates to systems and methods for implementation of resistive switching memories. More particularly, the systems and methods discussed herein may incorporate a diode structure or the like into a memory cell.

BACKGROUND OF THE INVENTION

The interest in resistive-based nonvolatile memory, memresistors, or memristors is based upon on the potential for the development of next generation memory devices because the existing Si-based CMOS (complementary metal oxide semiconductor) transistor technology is rapidly approaching its fundamental scaling limitations and fabrication cost is also rapidly increasing due, in part, to the requisite reduction in the transistor size.

Crossbar architectures with switching material sandwiched between bit lines and word lines have been proposed as a potential candidate that will be easily scalable. However, a crossbar architecture may lead to misreading the switching state of a designated cell. For example, cross-talk may lead to misreading of the state of a cell. The systems and methods discussed herein prevent cross-talk issues by incorporating a diode structure or the like into a memory cell.

SUMMARY OF THE INVENTION

In some embodiments, the present invention pertains to resistive memories cells incorporating a diode structure or the like. In various embodiments, such resistive memory cells generally comprise: (1) a first electrode; (2) a second electrode; (3) a resistive memory material; and (4) a diode structure or the like. In some embodiments, the resistive memory material may be sandwiched between the two electrodes. In some embodiments, the diode structure or the like may also be sandwiched between the two electrodes. In some embodiments, the resistive memory cell has two terminals. In some embodiments, the electrodes are perpendicular to each other. In some embodiments, the diode structure may be an n-p diode, a p-n diode, and a Schottky diode.

In some embodiments, the resistive memory material comprises one or more $SiO_x$-based compositions, such as $SiO_x$, $SiO_xH$, $SiO_xN_y$, $SiOxN_yH$, $SiO_xC_z$, $SiO_xC_zH$, and combinations thereof. In such embodiments, x, y and z may each be equal to or greater than 1 and equal to or less than 2.

In some embodiments, the resistive memory material may also comprise a compound containing at least three elements (i.e., an "MEA compound"), where "M" is selected from the group consisting of Si, C, Ge, In, Sn, Pb, Ti, Zr, Hf, Sr, Ba, Y, La, V, Nb, Ta, Cr, Mo, W, Fe, Ni, Cu, Ag, Zn, Al, Pt and combinations thereof; "E" is selected from the group consisting of O, N, P, B, Sb, S, Se, Te, and combinations thereof; and "A" is selected from the group consisting of H, Li, Na, K, F, Cl, Br, I and combinations thereof.

In further embodiments, the present invention provides resistive memory arrays that comprise: (1) a plurality of bit lines; (2) a plurality of word lines; (3) a plurality of resistive memory cells that are positioned between the bit lines and word lines; and (4) a diode structure or the like. Additional embodiments of the present invention pertain to methods of making the resistive memory cells and resistive memory arrays of the present invention. As set forth in more detail below, the resistive memories and resistive memory arrays of the present invention have numerous applications in various fields and environments, including applications as flash memory drive replacements in radiation rich environments, such as outer space.

The foregoing has outlined rather broadly various features of the present disclosure in order that the detailed description that follows may be better understood. Additional features and advantages of the disclosure will be described hereinafter.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein:

FIG. 3 is a SEM image of 1 k bit crossbar memory structure;

FIGS. 4a and 4b show a crossbar structure of 1D-1R device and a circuit diagram schematic of the resistive memory material and diode structure;

DETAILED DESCRIPTION

Figure 1:
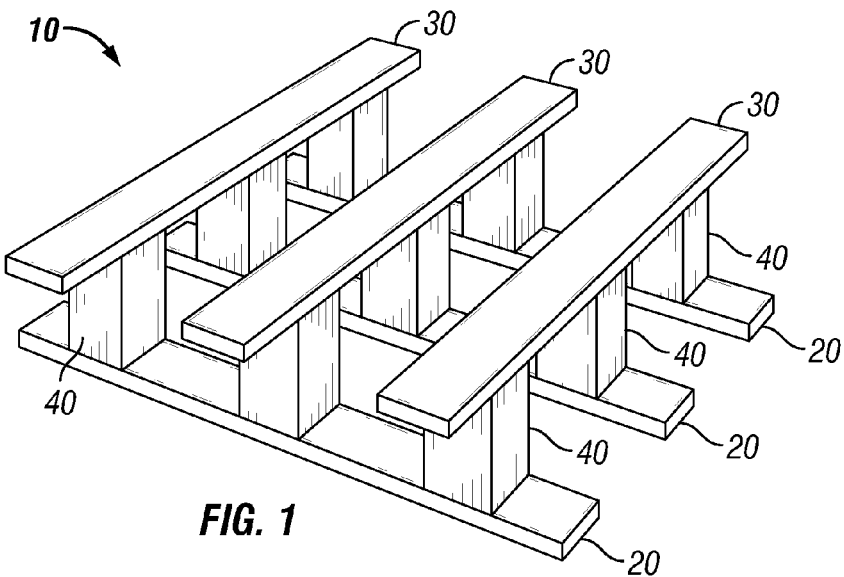
FIG. 1 shows an illustrative embodiment of a crossbar structure for a resistive memory array.

It is to be understood that both the foregoing general description and the following detailed description are exemplary and explanatory only, and are not restrictive of the invention, as claimed. In this application, the use of the singular includes the plural, the word "a" or "an" means "at least one", and the use of "or" means "and/or", unless specifically stated otherwise. Furthermore, the use of the term "including", as well as other forms, such as "includes" and "included", is not limiting. Also, terms such as "element" or "component" encompass both elements or components comprising one unit and elements or components that comprise more than one unit unless specifically stated otherwise.

The section headings used herein are for organizational purposes only and are not to be construed as limiting the subject matter described. All documents, or portions of documents, cited in this application, including, but not limited to, patents, patent applications, articles, books, and treatises, are hereby expressly incorporated herein by reference in their entirety for any purpose. In the event that one or more of the incorporated literature and similar materials defines a term in a manner that contradicts the definition of that term in this application, this application controls.

Various embodiments of resistive memory arrays and methods for producing the arrays are discussed herein. Is various embodiments, a resistive memory array may include a plurality of memory cells or resistive memories arranged in a crossbar structure. In various embodiments, such resistive memory cells generally comprise: (1) a first electrode; (2) a second electrode; and (3) a resistive memory material between the two electrodes. In some embodiments, the electrodes may be word lines or bit lines or a memory array. In addition to the resistive memory material, a diode structure or the like may also be positioned between the two electrodes. In some embodiments, the diode structure may be an n-p diode, a p-n diode, a Schottky diode, or any other suitable diode.

In further embodiments, the resistive memory arrays comprise: (1) a plurality of bit lines; (2) a plurality of word lines that are orthogonal to the bit lines conductors; (3) a plurality of resistive memory cells positioned between the word lines and bit lines; and (4) a plurality of diode structures or the like positioned between the word lines and bit lines. Additional embodiments provide methods of forming resistive memory cells with diode structures, methods of forming resistive memory arrays with diode structures, and devices that incorporate such resistive memory cells and arrays.

In further embodiments, a method of forming a resistive memory cell or array may comprise the steps of (1) depositing a first electrode on insulating substrate; (2) depositing a resistive memory material; (3) depositing diode materials; and (4) depositing a second electrode. In some embodiments, the diode materials may be n-type and p-type material to form a n-p diode or a p-n diode. In some embodiments, the diode materials may be metal and/or semiconductor materials utilized to form a Schottky diode or any other suitable diode.

Resistive memory generally refers to a memory utilizing compositions with electrical conductivity that can be reversibly modified by application of different bias voltages. In some embodiments, the resistive memory may be resistive random access memories (ReRAMs), which are random access memories that utilize resistive memory material(s). In some embodiments, the resistive memory may be memristors, memresistors, or the like. It should be noted that embodiments discussed herein may utilize the terms ReRAM, memresistor, and memristor interchangeable since each may alternatively utilize in the embodiments discussed herein.

Examples of resistive switching memory arrays have been discussed in International Application No. PCT/US2011/050812 filed Sep. 8, 2011, the entirety of which is incorporated herein by reference. A basic discussion of resistive memory cells and arrays is also provided below.

Substrate

Substrates in resistive memory cells generally refer to compositions that can house or support the device. In some embodiments, the substrate is a semiconducting substrate. In some embodiments, the substrate is an insulating substrate. In more specific embodiments, the substrate also contains a dielectric layer. In some embodiments, the substrate may also contain an oxide layer. Examples of substrate compositions include, without limitation, silicon, silicon dioxide, aluminum oxide, sapphire, germanium, gallium arsenide (GaAs), alloys of silicon and germanium, indium phosphide (InP), and combinations thereof. The substrates of the present invention may also have various shapes. For instance, in some embodiments, the substrates may be in the form of discs (e.g., wafers), cylinders, cubes, spheres, and the like.

Electrodes

In various embodiments, a resistive memory cell may provide two or more electrodes. Various conductive elements may be utilized for the electrodes. In some embodiments, the conductive elements may include polysilicon, n-doped polysilicon, p-doped polysilicon, doped single-crystal silicon, metal silicides, and various metals. Metals that can be utilized as conductive elements include, without limitation, tungsten, titanium, titanium nitride, titanium silicide, titanium tungsten, cobalt silicide, nickel silicide, tantalum, tantalum nitride, aluminum, gold, and copper.

Resistive Memory Materials

Resistive memory materials generally refer to compositions with electrical conductivity that can be reversibly modified by application of different bias voltages. In some embodiments, one programming bias voltage will drive the resistive memory material into a high-conductivity state, and another programming bias voltage will drive the resistive memory material into a low-conductivity state. The state of the resistive memory material can be determined by applying a third bias voltage and measuring the current flow through the resistive memory material, where the third bias voltage does not alter the programmed state. Resistive memory materials are further generally classified as being bipolar, which requires the programming voltage polarity to be different, or as being unipolar, where all programming and state measurement voltages are of a single polarity.

In some embodiments, resistive memory materials can act as a reversible memory. In some embodiments, the resistive memory material has one or more programmable resistance states. In some embodiments, the resistive memory material may also exhibit a reversible switching mechanism.

Various resistive memory materials may be used in the resistive memory cells of the present invention. In some embodiments, the resistive memory materials include, without limitation, Si, O, H, C and N. In more specific embodiments, the resistive memory materials include, without limitation, $SiO_x$, $SiO_xH$, $SiO_xN_y$, $SiO_xN_yH$, $SiO_xC_z$, $SiO_xC_zH$, and combinations thereof. In such embodiments, each of x, y and z may be equal to or greater than 1 and equal to or less than 2. In some embodiments, the x ratio of $O_x$ to Si is greater than or equal to 0 and less than or equal to 2. In some embodiments, the y ratio of $N_y$ to Si is in the range from 1.33 to 0. In some embodiments, the z ratio of $C_z$ to Si is in the range from 1 to 0.

In some embodiments, the resistive memory material may also include a compound containing at least three elements (i.e., an "MEA" compound), where "M" is at least one of Si, C, Ge, In, Sn, Pb, Ti, Zr, Hf, Sr, Ba, Y, La, V, Nb, Ta, Cr, Mo, W, Fe, Ni, Cu, Ag, Zn, Al, Pt and combinations thereof; "E" is at least one of O, N, P, B, Sb, S, Se, Te, and combinations thereof; and "A" is at least one of H, Li, Na, K, F, Cl, Br, I and combinations thereof. In more specific embodiments, the resistive memory material consists of $SiO_2$, such as amorphous $SiO_2$ or hydrogenated $SiO_2$. In some embodiments, the resistive memory cell is hydrogenated $SiO_2$ that is exposed to thermal anneal in ambient containing at least one of $H_2$, $H_2O$ and $D_2$.

In some embodiments, the resistive memory material has one or more programmable resistance states. In some embodiments, the resistive memory material has two programmable resistance states. In more specific embodiments, the current difference between the two programmable resistance states is at least greater than 1,000,000 to 1. In various other embodiments, the current difference between the two programmable resistance states is at least greater than 100,000 to 1, at least greater than 10,000 to 1, at least greater than 1000 to 1, at least greater than 100 to 1, or at least greater than 10 to 1.

In some embodiments, the resistive memory material may have three or more programmable resistance states. In some embodiments, the resistive memory material has three programmable resistance states that consist of a low current state (e.g., $10^{-12}$ to $10^{-9}$ A), a medium current state (e.g., $10^{-9}$ to $10^{-6}$ A) and a high current state (e.g., $10^{-6}$ to $10^{-3}$ A).

The resistive memory materials of the present invention may also have various programmable properties. For instance, in some embodiments, the resistive memory materials may not be programmable by heat, X-ray, heavy ion irradiation, or heavy proton irradiation. In some embodiments, the resistive memory materials may retain their state when exposed to heat, X-ray, heavy ion irradiation, or heavy proton irradiation.

The resistive memory materials of the present invention may also have various heating properties. For instance, in some embodiments, the resistive memory materials may not be programmable by heating at temperatures of less than about 200° C. for periods of time ranging from less than 5 seconds to more than 30 minutes. In some embodiments, the resistive memory materials may not be programmable by heating at temperatures of less than about 300° C. for periods of time ranging from less than 5 seconds to more than 30 minutes. In some embodiments, the resistive memory materials may not be programmable by heating at temperatures of less than about 400° C. for periods of time ranging from less than 5 seconds to more than 30 minutes.

In some embodiments, the resistive memory materials of the present invention may be in the form of layers with various thicknesses. For instance, in some embodiments, the resistive memory materials may have thicknesses that range between about 10 nm to about 1000 nm. In some embodiments, the resistive memory materials may have thicknesses that range from about 1 μm to about 10 μm. The resistive memory materials of the present invention may also have various shapes, including square-like shapes, circular shapes, and rectangular shapes.

In some embodiments, the resistive memory materials of the present invention may also be associated with two or more conductive elements, such as electrodes and the conductive elements described previously. In more specific embodiments, the resistive memory materials of the present invention are associated with two electrodes.

Resistive Memory Arrays

Additional embodiments of the present invention pertain to resistive memory arrays. Such arrays generally include a plurality of bit lines, a plurality of word lines orthogonal to the bit lines, and a plurality of resistive memory cells (as previously described). The resistive memory cells can be positioned between the word lines and bit lines in various arrangements. In some embodiments, the resistive memory cells may be ReRAM cells, memresistors, memristors, or the like.

For instance, in some embodiments, a substrate of a resistive memory cell may be in contact with a bit line while the resistive memory material may be in contact with a word line. Likewise, in other embodiments, a substrate may be in contact with a word line while the resistive memory material may be in contact with a bit line. In further embodiments, the bit line and the word line may be in direct contact with the electrical switches of resistive memory cells. In some embodiments, the bit lines and word lines may represent or define the conductive elements associated with the electrical switches in resistive memory cells. In some embodiments, a resistive memory array may be stacked on top of one or more resistive memory arrays utilizing any suitable stacking arrangement. Note that in some embodiments of a stacked arrangement, the bottom electrodes of a first resistive memory array stacked on top of a second resistive memory array may serve as the top electrodes of the second resistive memory array.

Methods of Making Resistive Memory Cells and Arrays

Various methods may be used to deposit the materials utilized in a resistive memory cell or array. Such methods may include, without limitation, chemical vapor deposition (CVD), low-pressure chemical vapor deposition (LPCVD), plasma-enhanced chemical vapor deposition (PECVD), atomic layer deposition (ALD), thermal oxidation, electron-beam evaporation, physical sputter deposition, reactive sputter deposition, and spin coating followed by curing. In some embodiments, the methods may also include a thermal anneal process. In some embodiments, the aforementioned methods may occur under various temperatures and ambient conditions. An exemplary temperature range includes, without limitation, from about 200° C. to about 1200° C. Exemplary sets of thermal anneal ambients include, without limitation, oxygen, nitrogen, argon, helium, hydrogen, deuterium, water vapor, and combinations thereof. In some embodiments, a formed resistive memory material may also be etched by various mechanisms.

For instance, in various embodiments where the resistive memory material is substantially $SiO_x$, $SiO_x$ may be deposited using CVD, LPCVD, PECVD, thermal oxidation of Si, electron-beam evaporation of $SiO_2$, physical sputter deposition from $SiO_2$, reactive sputter deposition from Si target in $O_2$, and spin-coating followed by curing.

Likewise, a method of forming an MEA-containing resistive memory material is to selectively include Si, O, H, C and N in the PECVD process or post deposition processes to incorporate these components into a resistive memory material component (e.g., $SiO_xN_y$, $SiO_xC_y$, $SiO_xH_y$). In some embodiments, the resistive memory material containing MEA may be deposited using PECVD from gaseous growth precursors (such as Si, O, N, H, and combinations thereof) to result in the formation of the resistive memory material components.

In some embodiments, the resistive memory material is first deposited as a $SiO_x$ layer followed by a thermal anneal process at an ambient temperature range from about 200° C. to about 1200° C. under $H_2$ flow. The formed $SiO_x$ layer may then be etched by a reactive ion etch (RIE) plasma with at least one RIE feed gas containing H so that H is incorporated into the etched surface to form $SiO_xH_y$. In some embodiments, the $SiO_x$ layer may be exposed to a hydrogen fluoride (HF)-containing etchant solution so that H is incorporated into the etched surface to form the compound $SiO_xH_y$, where the x ratio of O to Si is greater than or equal to 1 or less than or equal to 2. In some embodiments, the programmable resistive material comprises $SiO_x$ that receives a first treatment comprised of etching the $SiO_x$ layer to form a surface connecting the two conductive elements.

The etched surface may further receive a second treatment comprising a thermal anneal with temperature in the range from 200° C. to 1200° C. in an ambient containing $H_2$ or $H_2O$ to incorporate H and form compound $SiO_xH_y$ at the surface. Depending on anneal time and temperature, in the near-surface regions, the x ratio of O to Si may be greater than or equal to 1 or less than or equal to 2. In addition, the depth of H incorporation into the $SiO_x$ material may increase for higher temperatures and longer anneal times. Depending on the deposition method and process conditions, H content in as-deposited $SiO_2$ films can range from less than 1 atomic percent in dry thermal oxidation of Si to more than 20 atomic percent in films deposited using PECVD. Exposure to an additional thermal anneal containing H, either before or after etching the vertical edge, will allow a consistent H content to be achieved prior to device conditioning, which is described below. Furthermore, the defects associated with the introduction of H into the $SiO_x$ material may lower the voltage required to condition the device. In general, the H-containing ambient can have a balance of inert gases including $N_2$ and noble gases such as Ar and He. Other anneal ambients including deuterium ($D_2$), $N_2$ and inert noble gases, or combinations thereof, may also be used.

Thermal treatment at reduced pressure (~140 mTorr) or using purely inert ambients have also been shown to lower the voltage required for electroformation. Defects formed in $SiO_2$ by thermal stressing in ambients containing only inert gases are expected to form Si-rich $SiO_x$ with high levels of oxygen vacancy defects that readily absorb moisture when exposed to air or any other environment containing $H_2O$. As a result, these inert anneal ambients may also be used to promote formation of $SiO_xH_y$ compounds in the near-surface region.

In other embodiments, an MEA-containing resistive memory material may be deposited using a single deposition step, with component A being incorporated throughout the deposited layer, and with a layer thickness ranging from a few nanometers to a few micrometers. In other embodiments, a first active layer of composition ME is deposited, with thickness ranging from a few nanometers to a few micrometers. Next, component A is added to form compound MEA. Alternatively, the first layer of composition ME receives an etching treatment to form a surface, wherein component A is incorporated into the etched surface to form compound MEA during the etch treatment.

Conditioning Resistive Memory Cells

Various methods may be used to condition resistive memory cells. In some embodiments, the conditioning may occur by electroforming. Electroforming generally refers to a conditioning process that involves applying a voltage pulse from a low voltage to the conditioning voltage and then to the low voltage. In some embodiments, the conditioning voltage is less than 600 mV per nanometer of the thickness of the resistive memory material. In some embodiments, the voltage may be applied through the first and second conductive elements. In some embodiments, the conductive state is formed on the portion of the pulse from the conditioning voltage to the low voltage.

In some embodiments, the resistive material has at least two resistive states after electroforming: a high resistive state and a low resistive state. In some embodiments, the low resistance "ON" state is programmed by applying 3 to 5 volts across the first and second conductive elements. In some embodiments, the high resistance "OFF" state is set by applying greater than 6 volts and less than 20 volts between the first and second conductive elements.

In some embodiments, the resistive memory cells may be conditioned without electroforming. In some embodiments, a low resistance ON state may be programmed by applying a first voltage across the first and second conductive elements. The high resistance OFF state may be set by applying a second voltage between the first and second conductive elements. In such embodiments, a third voltage may be utilized to read the resistance state. In some embodiments, the ON state current is between $10^6$ and $10^4$ times that of the OFF state current. In some embodiments, ReRAM cells may be hermetically sealed or operated at certain level of vacuum or oxygen deficient environment such as an inert gas including $N_2$ or Ar.

The interest in resistive-based nonvolatile memory, resistive memory, ReRAMs, memresistors, or memristors is based upon on the potential for the development of next generation memory devices because the existing Si-based CMOS transistor technology is rapidly approaching its fundamental scaling limitations and its fabrication cost is also rapidly increasing due, in part, to the requisite reduction in the transistor size.

The desirable device structure for high density is the crossbar architecture composed of two electrode lines (bit-lines for bottom electrodes and word-lines for top electrodes) with memory materials sandwiched between them, as shown in FIG. 1. In some embodiments, the electrodes may be perpendicular to each other. In other embodiments, the angle between the electrodes may be 0 to 90 degrees.

FIG. 1 shows an illustrative embodiment of a crossbar structure for a resistive memory array 10. The bit lines 20 are shown on the bottom and the word-lines 30 on the top, with the resistive memory material 40 sandwiched between these two lines as each crosspoint. However, in other embodiments, the word and bit lines could be inverted.

This crossbar structure has been considered as the most attractive candidate to resolve the physical scaling issue of current Si-based memory. It is two-terminal-based, meaning just the bit- and word-lines. If a transistor were needed, as in present-day CMOS memories, then a third electrode line is required, making the package harder to scale to small dimensions and making it difficult to apply to 3-dimensional (3D) stacking architectures, the latter required for ultra-dense memories of the future. Further, the planar integration density of memory with the crossbar structure could be scaled to $4F^2$ (F=minimum feature size) which is the highest density attainable 2D planar memory architecture. Conversely, the integration density of conventional Si-based memory with its transistors at every crosspoint is $6F^2$ to $8F^2$.

Cross-Talk

Figure 2A:
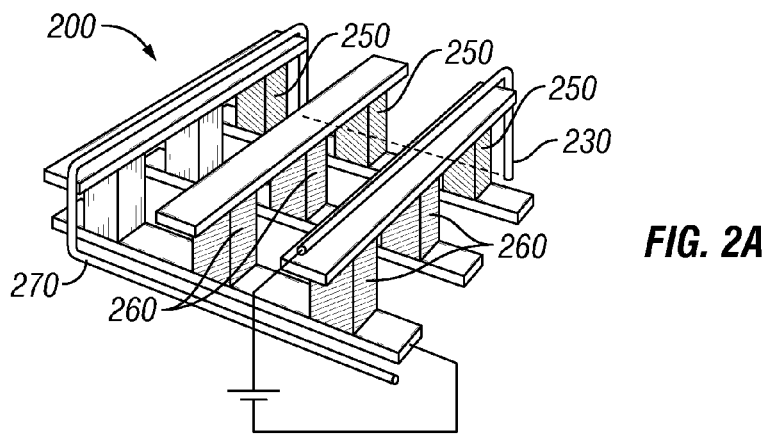
FIGS. 2a and 2b provides illustrative examples of cross-talk in a crossbar array and SEM image of a crossbar array.
Figure 2B:
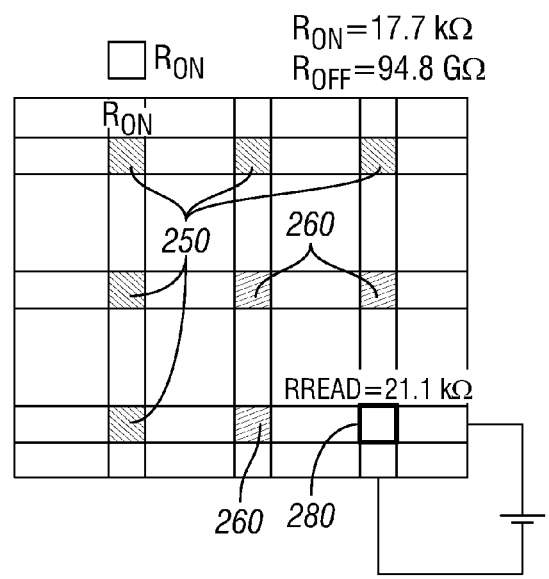

Unfortunately, the crossbar structure for memory (as in FIG. 1) could lead to misreading the switching state (i.e., on and off state of memory) of designated cells. This is often called "cross-talk" between adjacent cells. For example, FIGS. 2a and 2b provides an illustrative example of cross-talk in a crossbar array 200. If the outside cells 250 are in the on-states (low resistance states) and the inside cells 260 are in the off-state (the high resistance state), the current 270 (paths in FIG. 2a) can flow though the adjacent on-state cells even though the external voltage is applied only to the inside cell. This result leads to misreading of the state as an "on-state" although this cell was originally in the "off-state." FIG. 2b shows an SEM image of crossbar structure for $SiO_x$ memory with outside cells 250 in the on-states and inside cells 260, 280 in the off-state. Inside cell 280 is in an off-state, but it may be misread as being in an "on-state" due to cross-talk.

FIG. 3 is a SEM image of 1 k bit $SiO_x$ crossbar memory structure 300. The boxes express 310 the only individual (isolable) cells (63 cells) in the device. Because of this cross-talk problem, if one were to fabricate a crossbar array, such as a 1 k bit (32 bit-lines×32 word-lines) crossbar memory structure, only 63 of the cells along the outside of the memory device could reliably have individual switching states properly readable, regardless of resistance states of the rest of the cells.

This cross-talk issue could be overcome by combining memory cells with switching cells, such as p-n diodes, Schottky diodes, and transistors. Therefore, the structures of a one transistor-one resistive switch (1T-1R) or one diode-one resistive switch (1D-1R) have been proposed to resolve the cross-talk problem.

Unipolar and Bipolar Memory

Generally, resistive-based memories can be categorized into unipolar and bipolar memories according to the required electric polarity for the switching. Note that most resistive-based memories are bipolar memory cells, while only a few unipolar memories have been proposed (Table 1).

In bipolar memory, the change of switching states requires a positive and negative voltage to switch between on and off states. For example, a positive voltage may be used for switching from the "off-state" to the "on-state" and a negative voltage for switching from the "on-state" to the "off-state". Thus, bipolar switching cannot be used for conventional 1D-1R architectures because the negative voltage needed to reset (erase) the cell to the off-state would be blocked by the diode. In other words, the negative voltage in 1D-1R devices will be dropped across the diode instead of across the memory cell due to the high resistance of the off-state in the diode. Hence, one cannot access the off-state in a 1D-1R system if a bipolar memory cell is used. Although transistors can be used for bipolar memory to form 1T-1R structures, employing transistors would offset the advantage of the crossbar structures since a third terminal would be needed (for the gain line) at each junction to support the requisite transistors and in turn making the high density system inaccessible. In other words, if one needs a third access line to all of the devices in the array, it cannot be easily scaled since the wiring becomes too burdensome: the integration density increases to $6F^2$ to $8F^2$.

TABLE 1

List of Resistive-Based Memories

| Materials | Memory nature | References |
| --- | --- | --- |
| $TiO_2$ | Bipolar | Appl. Phys. A 785 (2011) |
| $WO_3$ | Bipolar | Appl. Phys. A 791 (2011), Appl. Phys. A 857 (2011) |
| GeSe | Bipolar | Appl. Phys. A 791 (2011) |

TABLE 1-continued

List of Resistive-Based Memories

| Materials | Memory nature | References |
| --- | --- | --- |
| gap-type $Ag_2S$ | Bipolar | Appl. Phys. A 811 (2011) |
| $Cu—SiO_2$ | Bipolar | Appl. Phy. A 817 (2011) |
| $ZrO_2$ | Bipolar | Appl. Phy. A 827 (2011), Nanoscale Res. Lett. 7, 187 (2012) |
| $ZrO_2$:Cu | Bipolar | Appl. Phy. A 915 (2011) |
| $SiO_xN_y$ | Bipolar | Appl. Phy. A 927 (2011) |
| $In_2O_3$ nanocrystal/ZnO | Bipolar | Appl. Phy. A 933 (2011) |
| $SrTiO_3$ | Bipolar | Appl. Phy. A 939 (2011) |
| $BiFeO_3$ | Bipolar | J. Appl. Phys. 109, 124117 (2011) |
| Gd-doped $HFO_2$ | Bipolar | Appl. Phy. A 991 (2011) |
| $TiO_x/TiO_y$ | Bipolar | Appl. Phy. A 1009 (2011) |
| $GeO_x$/HfON/TaN | Bipolar | Adv. Mater. 23. 902 (2011) |
| NiO | Bipolar | Appl Phy. A 827 (2011) |
| NiO | Unipolar | Adv. Mater. 19, 73 (2007) |
| $SiO_x$ | Unipolar | Appl Phy. A 835 (2011) |
| $Al_xO_y$ | Unipolar | Appl Phy. Lett. 92, 223508 (2008) |
| ZnO | Unipolar | Appl. Phy. Lett. 98, 233505 (2011) |

Structures for individual cells using only the bipolar memory without any extra diode or transistors have been proposed. However, they have issues of relative low on-off ratio, instability of switching states, necessity of additional input pulses for "off-switching" of a designated cell, complexity in fabrication (leading to high fabrication cost), and difficulties in fabricating multilayer-stacking structures, thereby limiting the integration density.

In a unipolar memory, the change of the switching states can be operated in a unipolar manner (the set and reset voltage may share the same voltage polarity). Unipolar memory systems are more suitable for the 1D-1R structure leading to structures for high-density memory, multilayer-stacking integration and a simple fabrication process. In the 1D-1R structure, a diode would naturally suppresses the switching current in the memory cell under reverse bias without an additional input pulse, hence the cross-talk problem would be mitigated.

For example, FIG. 4a shows a crossbar structure of 1D-1R device 400. The crossbar structure provides bit lines 410 and word lines 420. Each memory cell comprises a diode 490 and resistive memory material 440 between the bit line 410 and word line 420. In the embodiment shown, the diode 490 is placed below the resistive memory material 440. However, in other embodiments, the arrangement may be modified. FIG. 4b is an illustrative circuit diagram schematic of the resistive memory material and diode structure of a memory cell.

In the embodiment shown, outside cells 450 are in the on-states and the inside cells 460 are in the off-state. The possible sneak path 430 of the cross-talk is blocked due to the diode off-resistance under reverse bias. The current can only flow in a designated cell.

Examples of 1D-1R Devices Using Unipolar Memory

In this section, we summarize the result of illustrative 1D-1R devices, as shown in FIGS. 5a-5c, 6a-6e, and 7a-7b.

ZnO Memory with Heterostructure (ZnO/NiO) Diode $10^3$ on-off ratio (0.5 V) of ZnO memory (from $10^{-6}$ A to $10^{-3}$ A)

Junction width: 10 μm

4×4 cross-bar array type

With diode, the on-off ratio (at 1 V) of 1D-1R device is ~$10^2$.

Figure 5A:
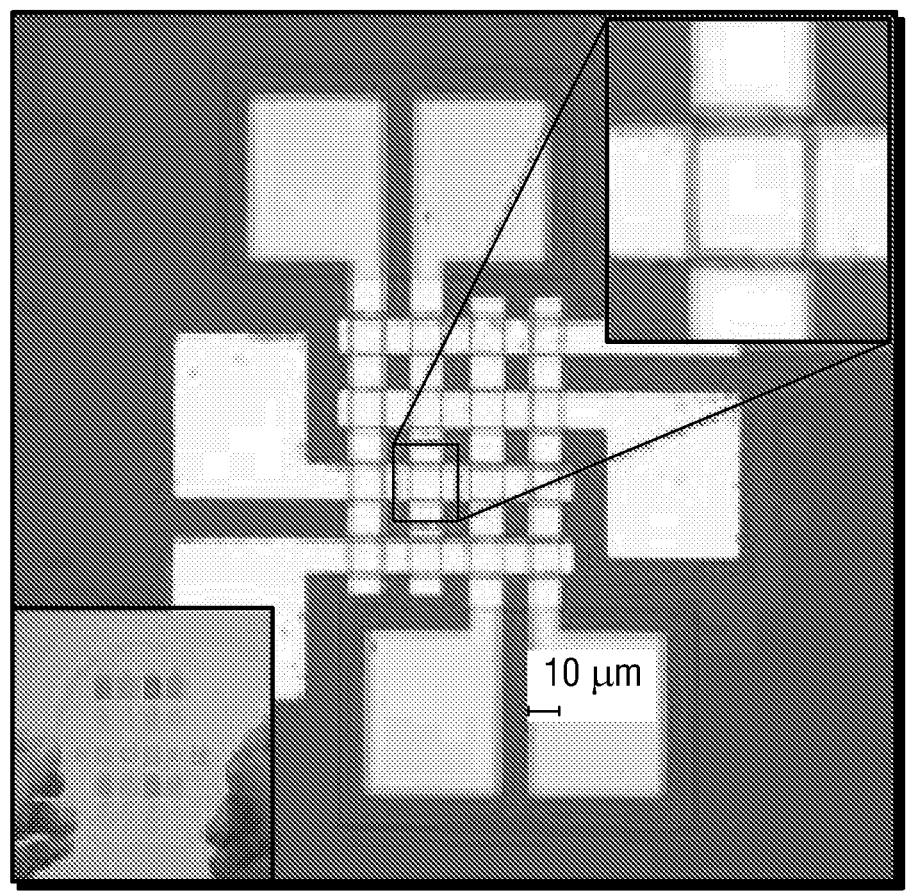
FIGS. 5a-5c show an optical image and electrical data for 1D-1R device based on ZnO memory with heterostructure (ZnO/NiO) diode.
Figure 5B:
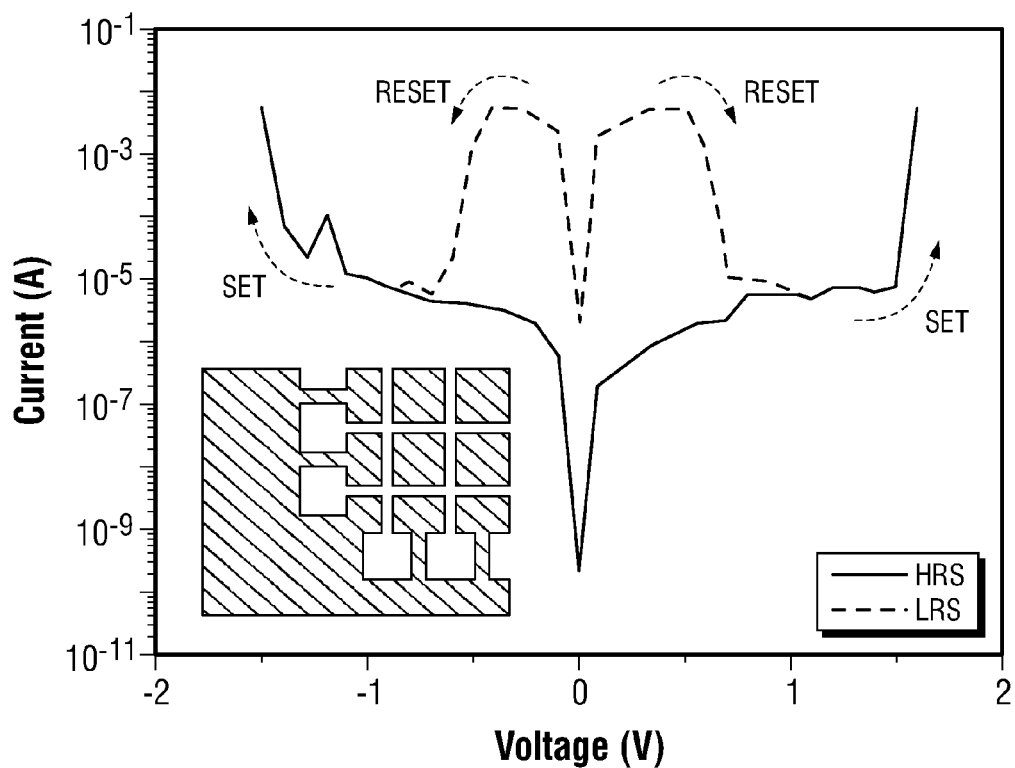
Figure 5C:
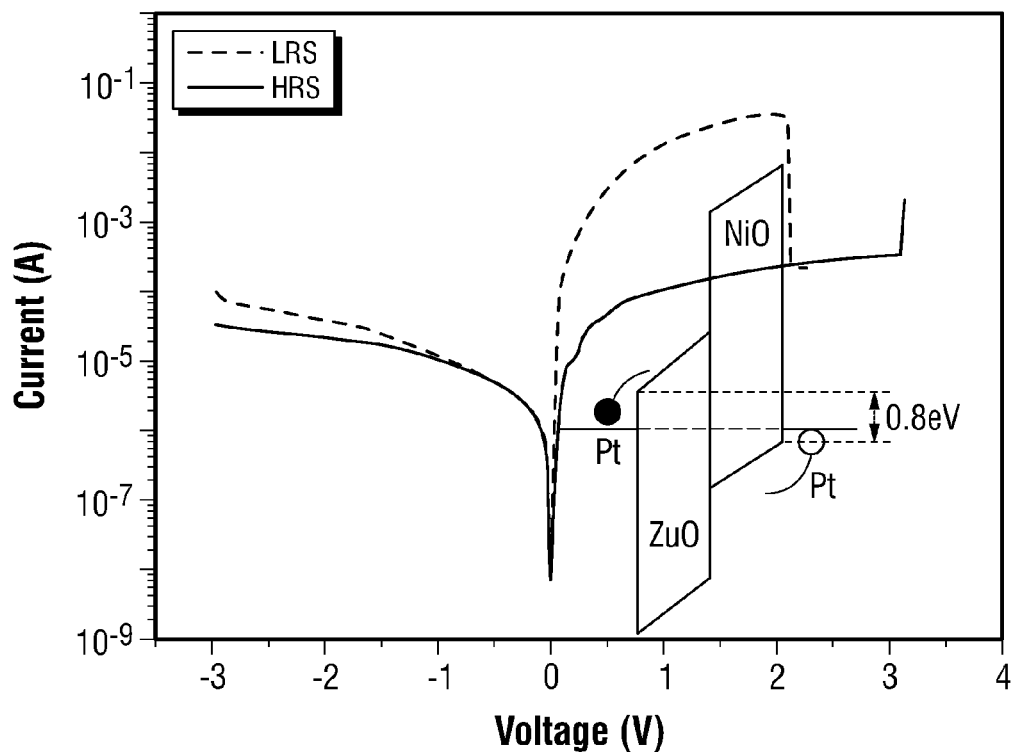
Figure 6A:
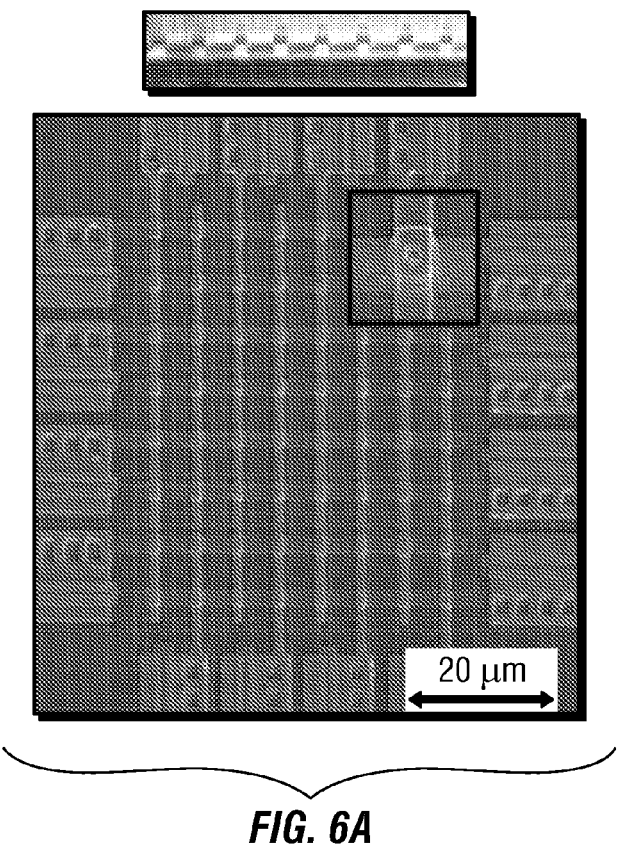
FIGS. 6a-6e show an SEM image, memory cells with and without a diode, and electrical data for 1D-1R device based on NiO memory with InZnO/CuO diode.
Figure 6B:
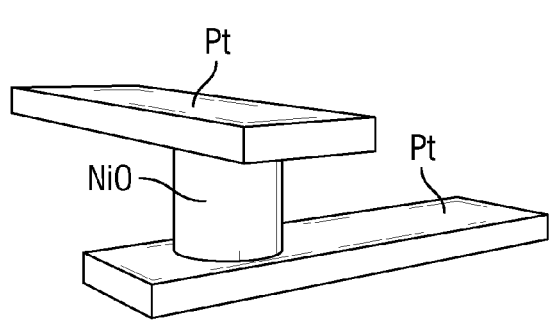
Figure 6C:
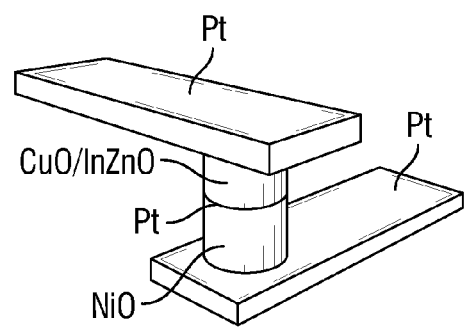
Figure 6D:
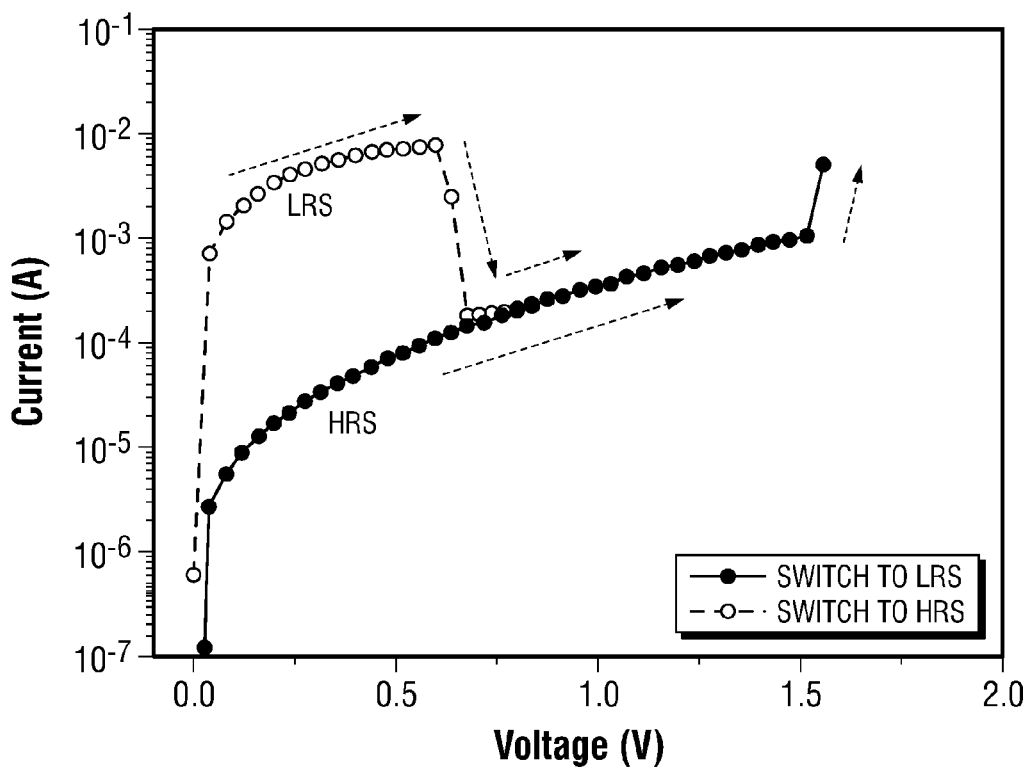
Figure 6E:
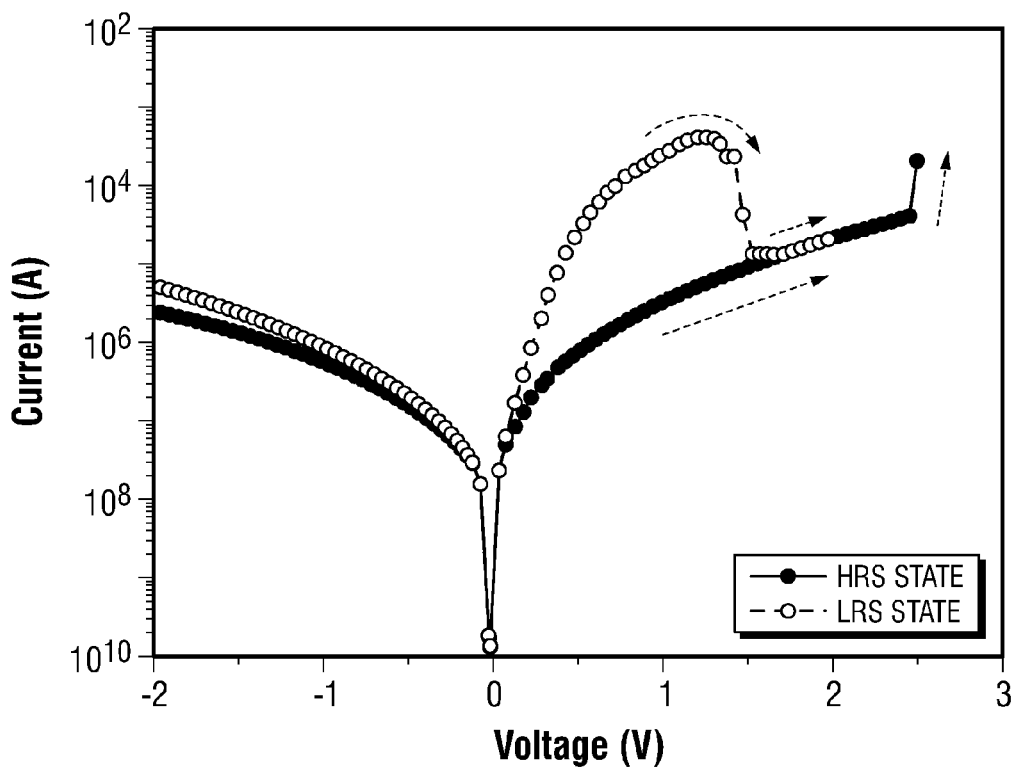

A ZnO memory with heterostructure (ZnO/NiO) diode is disclosed in J. W. Seo, S. J. Baik, S. J. Kang, Y. H. Hong, J. H. Yang, K. S. Lim, Applied Physics Letters 2011, 98, 233505-233503. FIGS. 5a-5c show an optical image and electrical data for 1D-1R device based on ZnO memory with heterostructure (ZnO/NiO) diode.

NiO Memory with InZnO/CuO Diode
$10^2$ on-off ratio (at 0.5 V) of NiO memory (from $10^{-5}$ A to $10^{-3}$ A)
Junction width: 0.5 μm
8×8 cross-bar array type
With diode, the on-off ratio (at 1 V) of 1D-1R device is <10.
A NiO memory with an InZnO/CuO diode is disclosed in M. J. Lee, S. I. Kim, C. B. Lee, H. Yin, S.-E. Ahn, B. S. Kang, K. H. Kim, J. C. Park, C. J. Kim, I. Song, S. W. Kim, G. Stefanovich, J. H. Lee, S. J. Chung, Y. H. Kim, Y. Park, Advanced Functional Materials 2009, 19, 1587-1593. FIGS. 6a-6e show an SEM image, memory cells with and without a diode, and electrical data for 1D-1R device based on NiO memory with InZnO/CuO diode.

NiO Memory with p-NiO$_x$/n-TiO$_x$ Diode
$10^3$ on-off ratio (at 0.5 V) of NiO memory (from $10^{-5}$ A to $10^{-2}$ A)
Junction width: 30 μm
Unicell
With diode, the on-off ratio (at 1 V) of 1D-1R device is $\sim 10^2$.

Figure 7A:
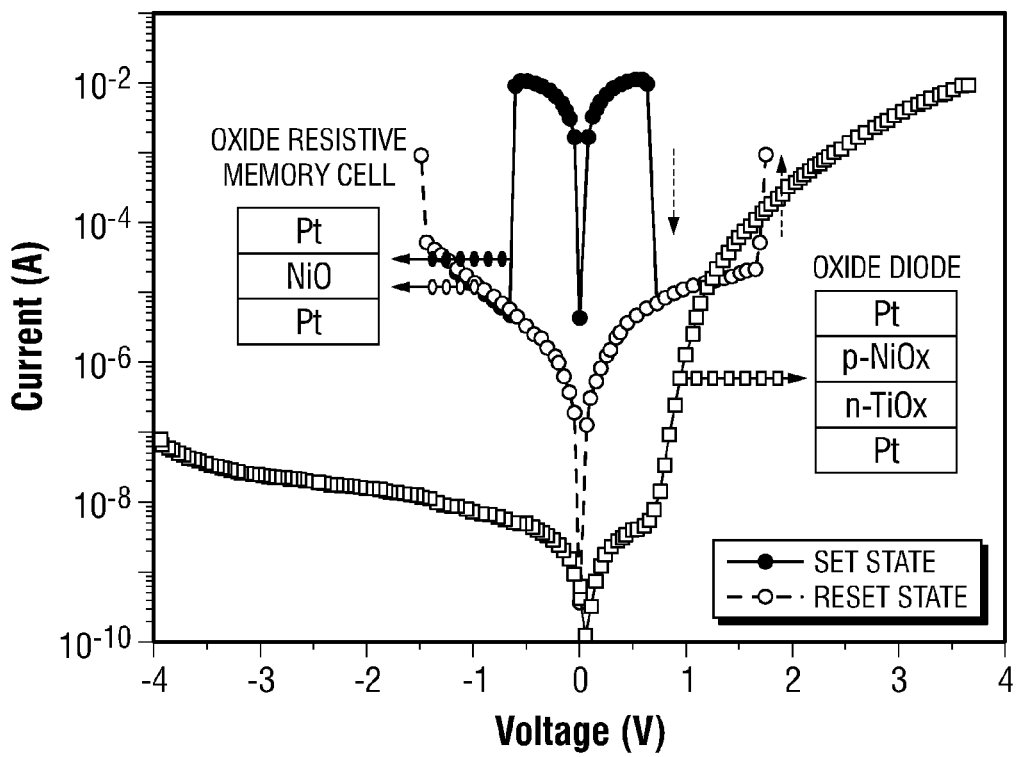
FIGS. 7a-7b show electrical data for 1D-1R device based on NiO memory with p-$NiO_x$/n-$TiO_x$ diode.
Figure 7B:
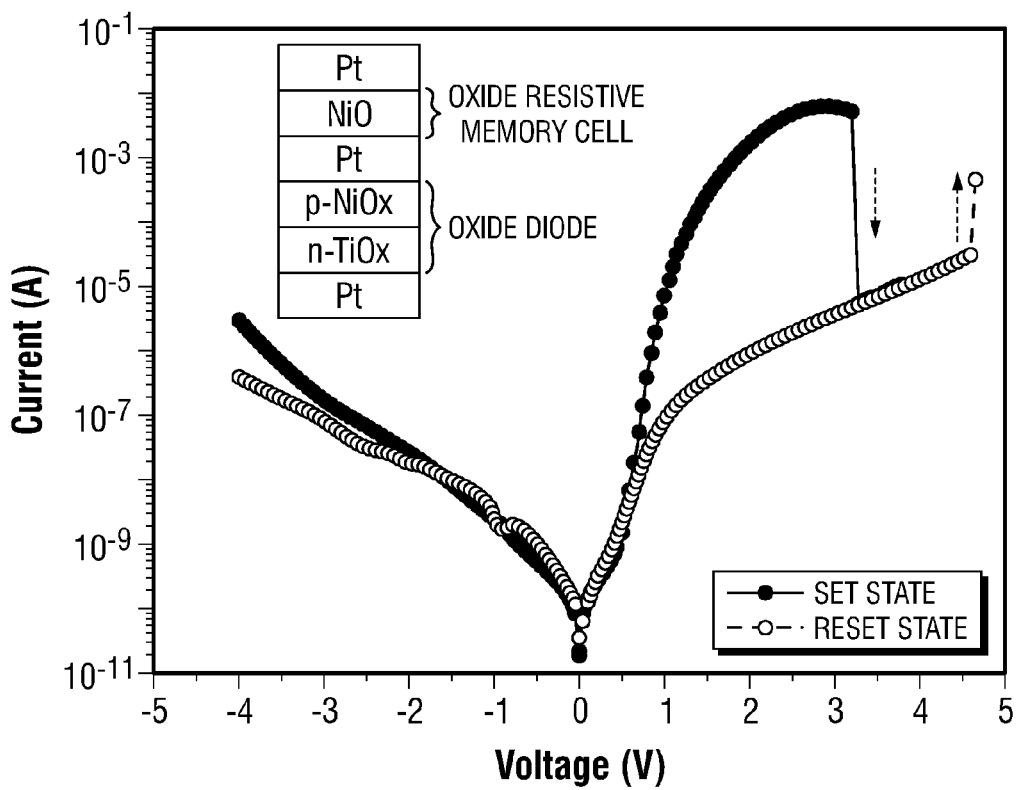

A NiO memory with p-NiO NiO$_x$/n-TiO$_x$ diode is disclosed in M. J. Lee, S. Seo, D. C. Kim, S. E. Ahn, D. H. Seo, I. K. Yoo, I. G. Baek, D. S. Kim, I. S. Byun, S. H. Kim, I. R. Hwang, J. S. Kim, S. H. Jeon, B. H. Park, Advanced Materials 2007, 19, 73-76. FIGS. 7a-7b show electrical data for 1D-1R device based on NiO memory with p-NiO$_x$/n-TiO$_x$ diode.

As shown in FIGS. 5a-5c, 6a-6e, and 7a-7b, compared with that of bipolar memory systems even at the micron-scale cell size, these unipolar systems discussed above have smaller on-off ratio ($10$-$10^3$). This low on-off ratio may lead to difficulty in using the 1D-1R structure with the conventional diodes due to the complexity of matching memory and diode current levels. Furthermore, in regard to scalability, these unipolar materials may have a physical limitation in cell size because the on-off ratio of memory would be smaller as the cell size is decreased. Thus these reported unipolar materials may not be suitable for nanoscale 1D-1R devices.

SiO$_x$ Memories in 1D-1R Devices

Figure 8:
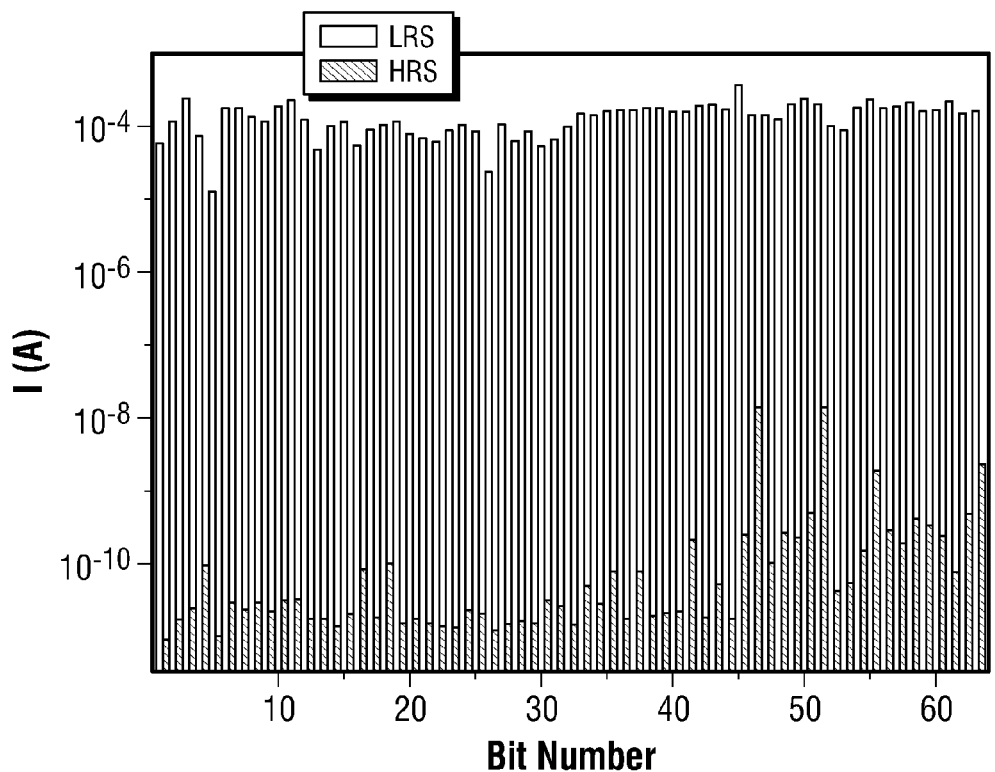
FIG. 8 shows low and high resistance states (LRS and HRS) of the 63 bits within a 1 kb $SiO_x$ crossbar array.
Figure 9:
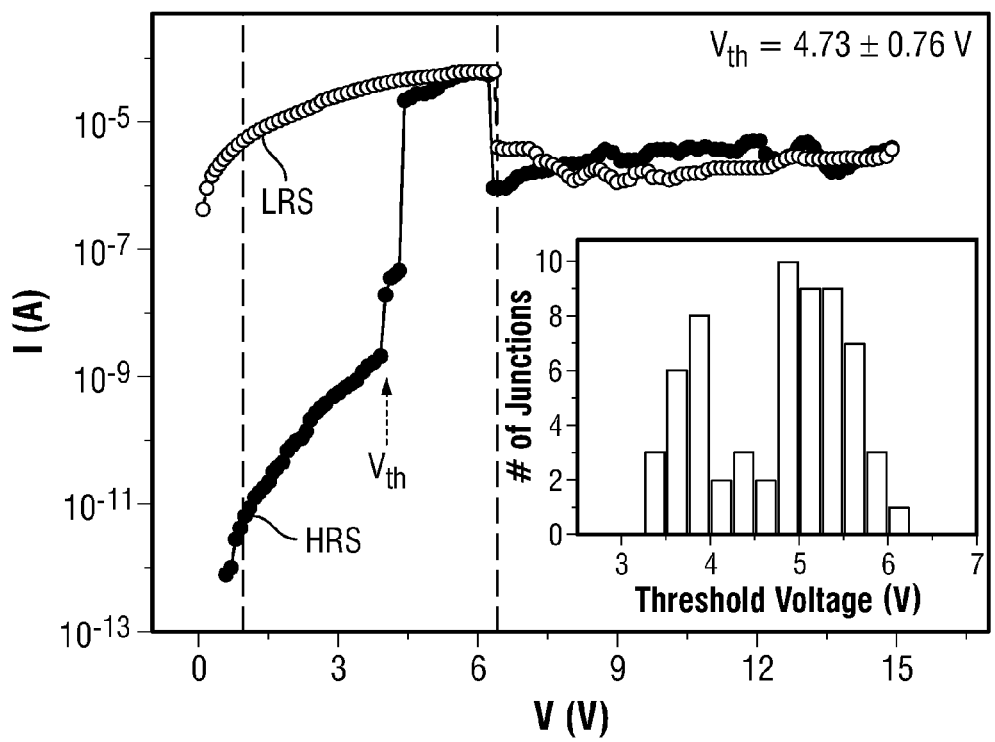
FIG. 9 shows I-V characteristics and threshold voltages of a $SiO_x$ memory device.
Figure 10:
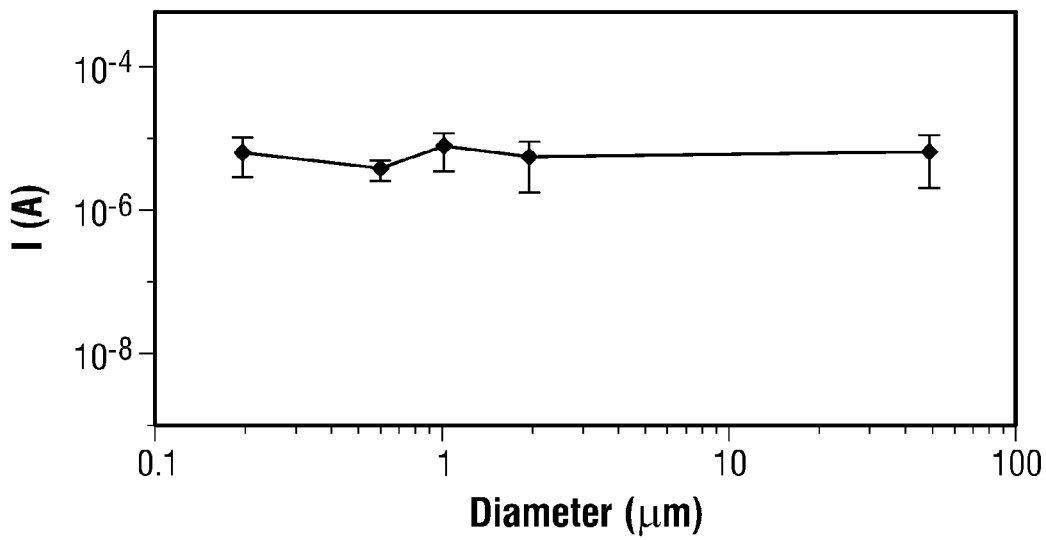
FIG. 10 shows the on-current versus junction diameter for $SiO_x$ memory device.

Advantages of SiO$_x$ memory system as compared with the other unipolar systems are discussed herein. SiO$_x$ memory has an on-off ratio of $10^5$ to $10^6$ at 1 V, which is the highest ratio, reported in unipolar resistive memory systems. FIG. 8 shows low and high resistance states (LRS and HRS) of the 63 bits within a 1 kb SiO$_x$ crossbar array. SiO$_x$ memory has a well-defined threshold voltage range and well-defined currents for the on and off states. FIG. 9 shows I-V characteristics and threshold voltages of a SiO$_x$ memory device. The on-current of SiO$_x$ memory typically does not depend on the junction size. Thus the current levels for "on" would be maintained at $10^{-5}$ to $10^{-6}$ A even when the devices are scaled into in the sub-nanoscale junction size. FIG. 10 shows the on-current versus junction diameter for SiO$_x$ memory device (J. Yao, Z. Sun, L. Zhong, D. Natelson, J. M. Tour, Nano Letters 2010, 10, 4105-4110). Note that the on current remains the same regardless of devices size. This is because the current relies upon a nanofilament that is sub-5 nm in diameter, hence, regardless of the devices size, the on current remains the same.

Figure 11:
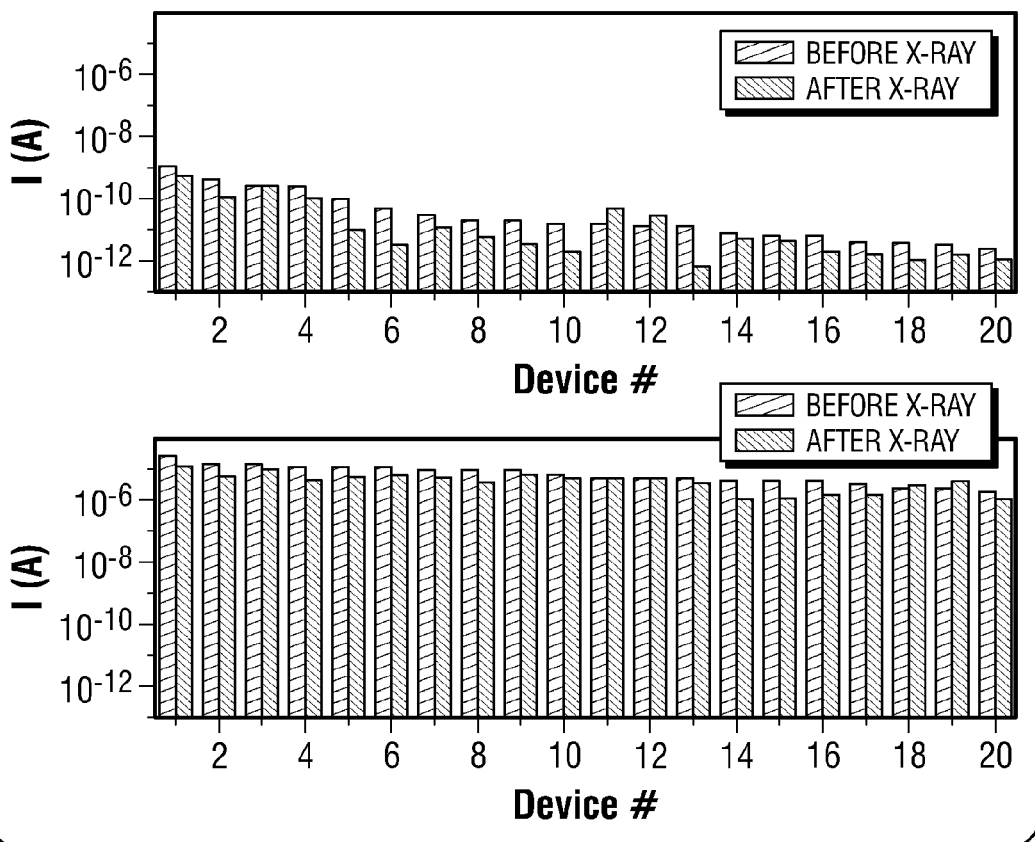
FIG. 11 shows conduction states before and after X-ray irradiation.

The SiO$_x$ memory system can be operated under ambient conditions by increasing the silicon-rich silica in oxide film. The SiO$_x$ materials are more accepted and far-better explored by the semiconductor industry than other unipolar memory materials which promotes shorter development period and lower fabrication cost. The SiO$_x$ memory system shows radiation-hard properties. The on and off states of SiO$_x$ memory system show no degradation after exposure to X-ray radiation (8 KeV) at 2 Mrad, a value more than 1 order of magnitude higher than the failure level of charge-based flash memory (FIG. 11). They have also been tested and shown to be robust to proton and heavy atom irradiation: (heavy-ion-tested by Sandia National Laboratory at Texas A&M beam line, $3 \times 10^5$ cm$^{-2}$S$^{-1}$ at 15 min exposure, ion fluence of $\sim 3 \times 10^8$ cm$^{-2}$); (proton tested by NASA JSC with 200 MeV protons to a total flux of 1500 rads (Si) at a fluence of 2.5E10 protons/cm$^2$). FIG. 11 shows conduction states (read at +1 V) before and after X-ray irradiation at a dose $\sim$2 Mrad in 40 devices, with 20 programmed to off (top panel) and 20 programmed to ob (bottom panel) (J. Yao, Z. Sun, L. Zhong, D. Natelson, J. M. Tour, Nano Letters 2010, 10, 4105-4110).

The unipolar SiO$_x$ memory cell adopts the typical layered structure with the SiO$_x$ ($1 \le x < 2$) layer sandwiched between the top electrode (TE) and bottom electrode (BE). In addition to the resistive memory material a diode may also be positioned between the electrodes. Examples of diodes suitable for use in the resistive memory cells include, without limitation, n-p diodes, p-n diodes, Schottky diodes, or any other suitable diodes. Examples of suitable diodes include, without limitation, semiconductor diodes, vacuum tube diodes, and thermionic diodes. In some embodiments, the diodes have multiple doped areas to form a p-n junction. For instance, the diodes may have first and second doped areas that are of different doping types. In some embodiments, the first doped area may be a p-doped area while the second doped area may be an n-doped area. In some embodiments, the diode may be formed from semiconductor materials or any other suitable materials. For example, the diode may be formed by depositing n-type and p-type silicon or non-silicon oxide-based materials to form a p-n junction. In some embodiments, the diode may be formed using a Schottky barrier, which can be formed by contact between a metal and semiconductor or contact between a metal and oxide-based material(s), such as TiO$_2$. In some embodiments, it may be desirable to reverse the position of the n-type and p-type material. In some embodiments, the Schottky barrier or diode may also provide rectifying properties.

Figure 12:
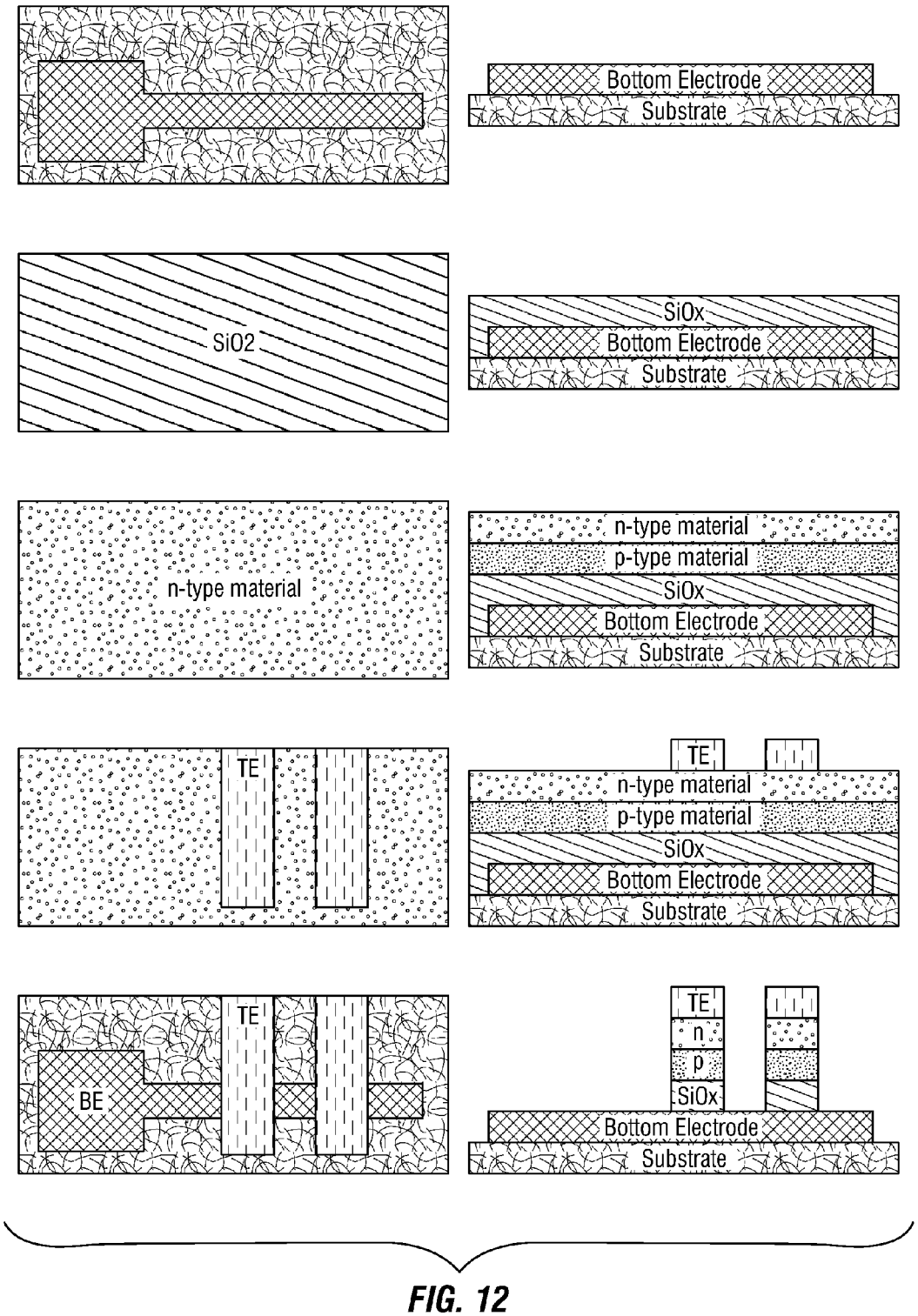
FIG. 12 shows the fabrication process of a BE/$SiO_x$/p-n junction/TE crossbar structure where BE=bottom electrode and TE=top electrode.
Figure 13:
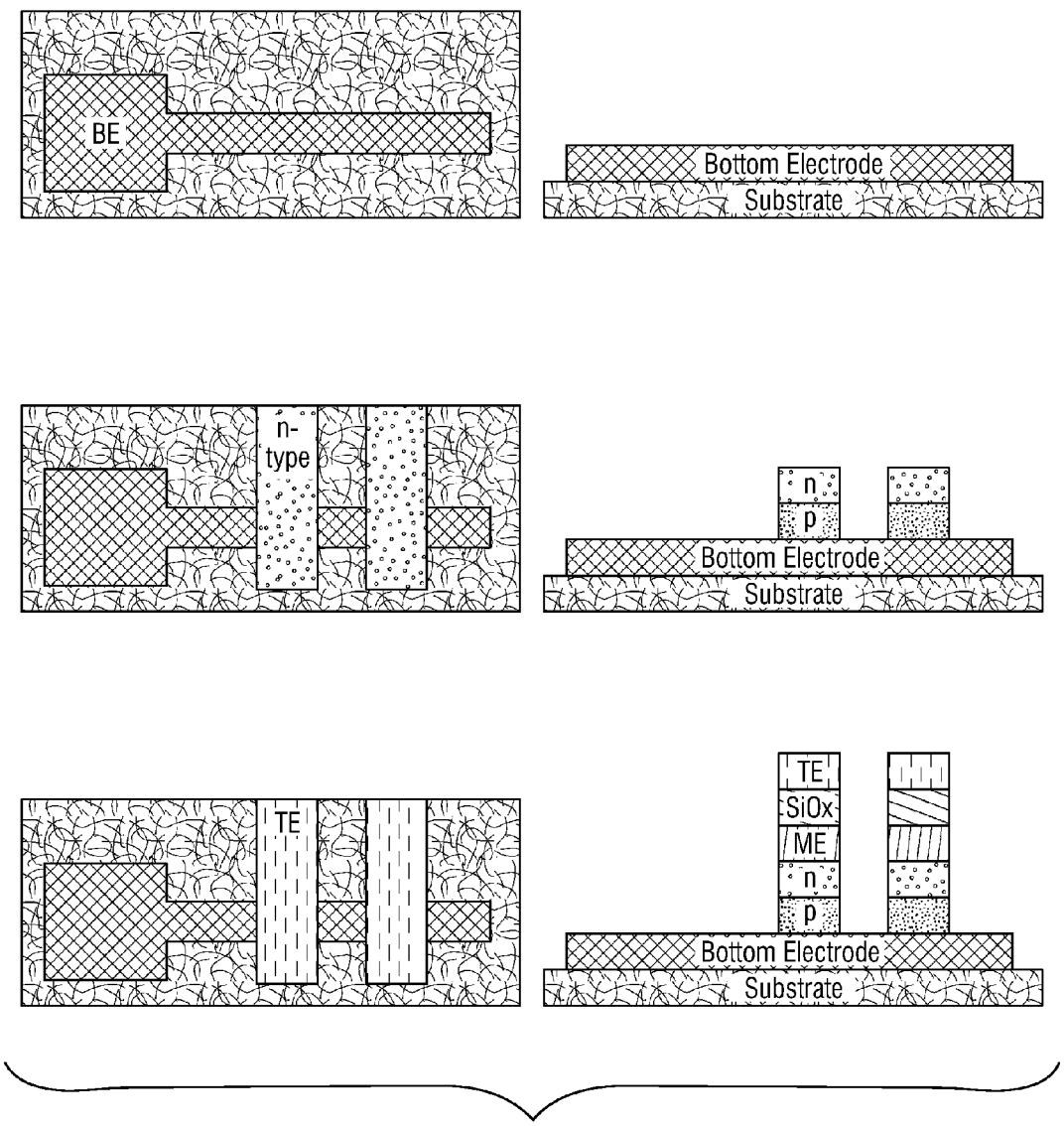
FIG. 13 shows fabrication steps for the BE/p-n junction/ME/$SiO_x$/TE crossbar structure where ME=metallic element or metallic layer.
Figure 14:
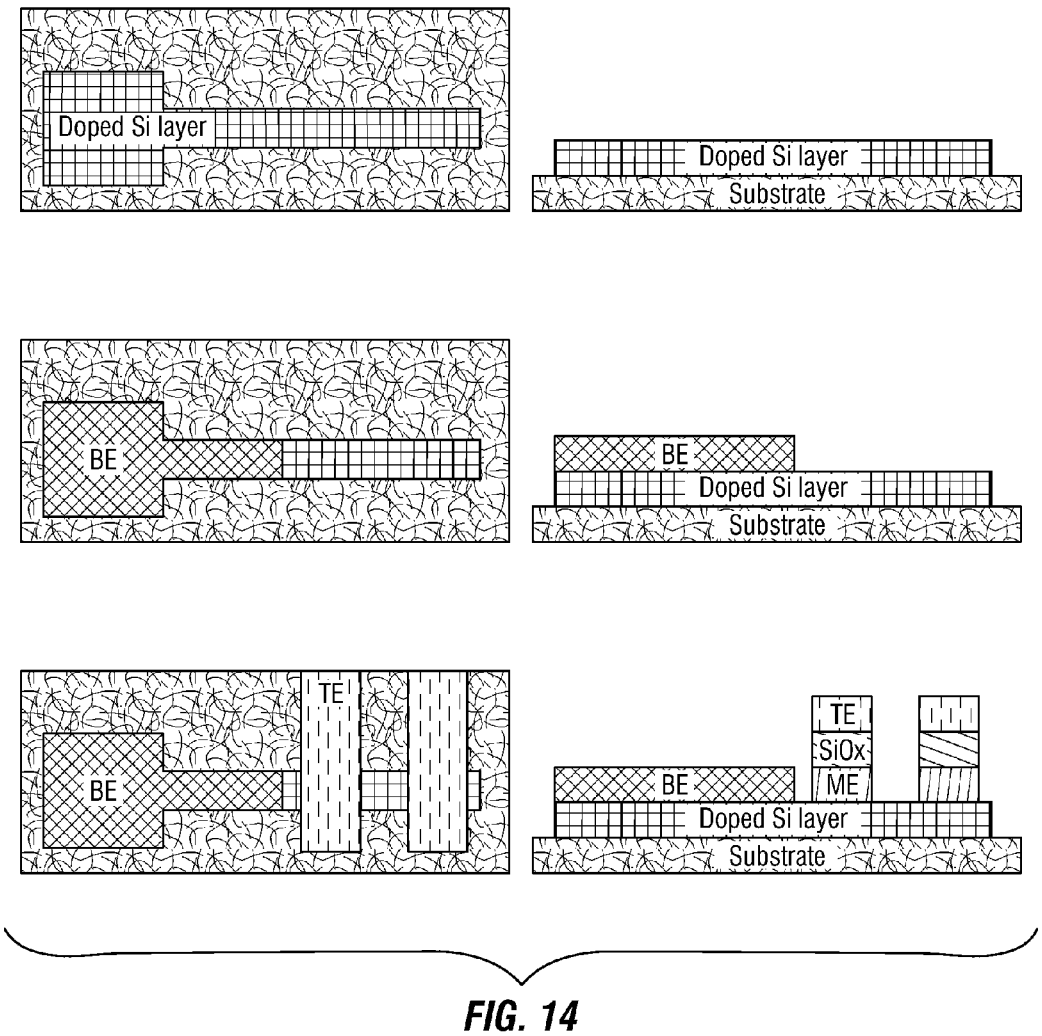
FIG. 14 shows fabrication steps for the BE/Schottky diode/ME/$SiO_x$/TE crossbar structure where ME=metallic element or metallic layer.

In this design, the p-n junction conveniently serves as the incorporated diode. Addressable crossbar memory architecture can then be built based on this design (FIGS. 12-14). The p-n junction rectifies the current. For example, in a forward bias (p-type connects with the positive terminal), the current flows across the p-n junction; in a reverse bias (n-type connects with the positive terminal), the current flow is prevented. In this way, the voltage applied between a pair of word and bit lines (with the top electrode connects to the positive terminal) only selects the memory unit sandwiched between them without affecting other neighboring units (see FIG. 4).

The details of the memory programming and readout in a SiO$_x$ memory unit has been previously discussed in International Application No. PCT/US2011/050812 filed Sep. 8, 2011, the entirety of which is incorporated herein by reference. Briefly, after the memory unit is electroformed into a switchable state, a moderate voltage pulse (e.g., 3 to 6 V) can set/write the unit into a low-resistance (on) state while a higher voltage pulse (e.g., >7 V) can reset/erase the unit to a high-resistance (off) state. These resistance states can serve as the binary code 0 and 1 in digital information. Once programmed, the resistance states (both on and off states) are nonvolatile. The memory readout shares the same electrode as the programming, only that at a lower voltage (e.g., <3 V), the memory is read. The memory state can be read nondestructively.

1D-1R Device Fabrication Methods

There are several possible fabrication methods for diode-incorporated crossbar structures. Several non-limiting examples of such fabrication methods are discussed herein.

1D-1R Device Using a p-n Junction Diode

BE)/SiO$_x$/p-n Junction/TE Crossbar Structure:

The fabrication process of a BE/SiO$_x$/p-n junction/TE crossbar structure is illustrated in FIG. 12. The fabrication steps for the BE/SiO$_x$/p-n junction/TE crossbar structure may include: (1) Deposition and defining of the BE (e.g., highly doped Si or metal) on an insulating substrate (e.g., SiO$_2$); (2) Deposition of SiO$_x$ (1≤x<2) on the BE layer; (3) Deposition of the p-n junction layer atop the SiO$_x$ layer. Note that the doping process for the silicon-based p-n-junction (e.g., ion implantation or spin-on-glass process) involves forming n- and p-type silicon layers; (4) Deposition and definition of the TE layer; and (5) The etching process (e.g., reactive ion etching (RIE)) performed to define the crossbar structure.

BE/p-n Junction/ME/SiO$_x$/TE) Crossbar Structure:

FIG. 13 shows fabrication steps for the BE/p-n junction/ME/SiO$_x$/TE crossbar structure. The fabrication steps may include: (1) Deposition and defining of the BE (e.g., highly doped Si or metal) on an insulating substrate (e.g., SiO$_2$); (2) Deposition and defining of the p-n junction layer atop the SiO$_x$ layer. Note that the patterned p-n junction is made with silicon based or non-silicon based p-n junction (e.g., an oxide-based p-n junction); and (3) Deposition and defining of metallic element or metallic layer (ME), SiO$_x$ (1≤x<2), and TE on the p-n junction layer. In some embodiments, the ME may act as a Schottky contact or Ohmic contact for a diode or memory. It is noted that the use of an ME does not affect the planar integration density.

1D-1R Device Using by Schottky Diode:

FIG. 14 shows fabrication steps for the BE/Schottky diode/ME/SiO$_x$/TE crossbar structure. The fabrication steps may include: (1) Deposition and defining of the doped (n- or p-type) Si layer (e.g., using an SOI wafer (silicon on insulator)) on an insulating substrate (e.g., SiO$_2$); (2) Deposition and defining of BE to form the ohmic contact with the doped Si layer; and (3) Deposition and defining of the ME (to form the Schottky barrier), SiO$_x$ (1≤x<2), and TE on the doped Si layer.

In some embodiments, any other types of diodes can replaced the abovementioned diodes. In some embodiments, chemical and physical treatments on surfaces could be varied to obtain optimum performances from the diodes. In some embodiments, the x value in SiO$_x$ could be varied to obtain optimum performance from memories. In some embodiments, the thickness of the layers (e.g., SiO$_x$, diode layer, and electrodes) in the structures could be varied to obtain optimum performance from the 1D-1R devices. In some embodiments, the feature size and form of the crossbar structure could be varied to obtain optimum performance from the 1D-1R devices. In some embodiments, the diode can be placed either above or below the SiO$_x$ switching layer with adequate choice of electrode material. In some embodiments, since silicon filaments are known to be responsible for the memory effect, other materials containing Si element could also be potential candidates as the unipolar memory material such as silicon-rich oxide (SiO$_x$, x<1), amorphous silicon, or even silicon nitride. In some embodiments, multi-bit storage capability can be obtained in a single SiO$_x$ memory unit. In some embodiments, a multi-stacking structure (e.g., 3D from stacked 2D) can be explored in a SiO$_x$ memory for ultra-dense memory arrays.

Experimental Example

Figure 15:
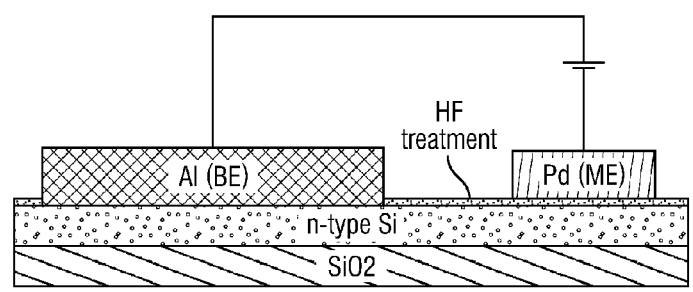
FIG. 15 shows the structure of a Schottky diode composed of an Al(BE)/n-type Si/Pd(ME)

An experimental example of 1D-1R single cell devices using SiO$_x$ unipolar memory material and a n-type Schottky diode is discussed herein. The structure of the Schottky diode is composed Al(BE)/n-type Si/Pd(ME), as shown in FIG. 15.

Figure 16:
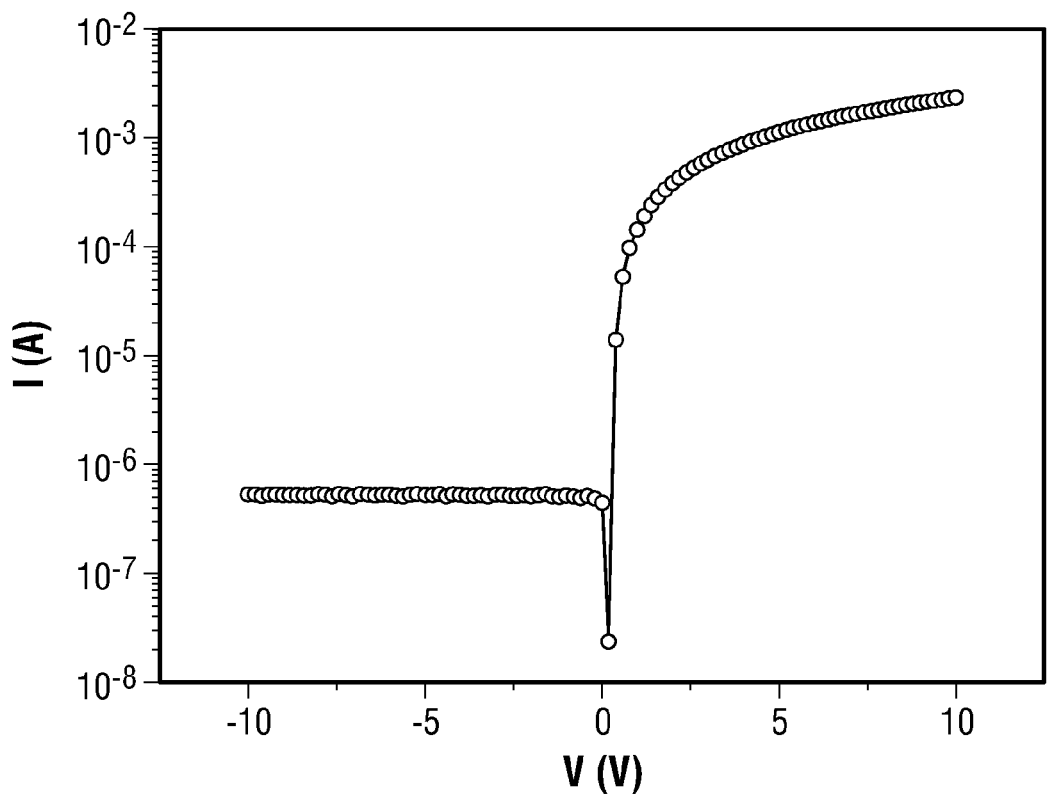
FIG. 16 shows the I-V characteristic of a Schottky diode.

FIG. 16 shows the I-V characteristic of the Schottky diode. The on-off ratio is approximately $10^3$ at ±3 V. This on-off ratio and current levels can match the current level of SiO$_x$ memory at the lead voltage regime (±~3 V). This on-off ratio can be enlarged with proper fabrication—this was merely a testbed case.

Figure 17:
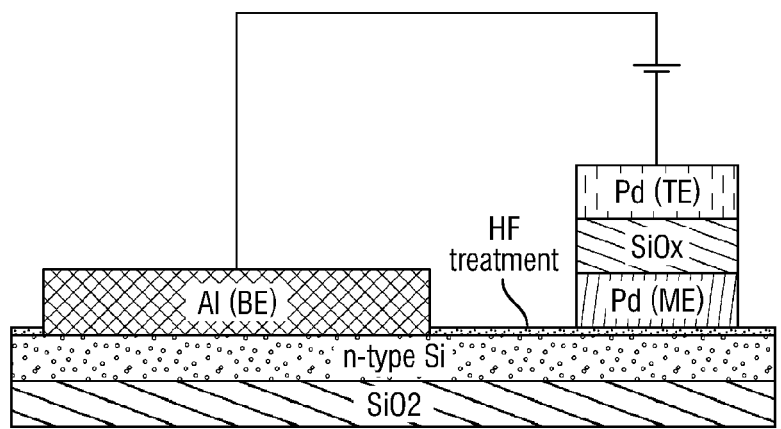
FIG. 17 shows the structure of 1D-1R single cell devices.
Figure 18A:
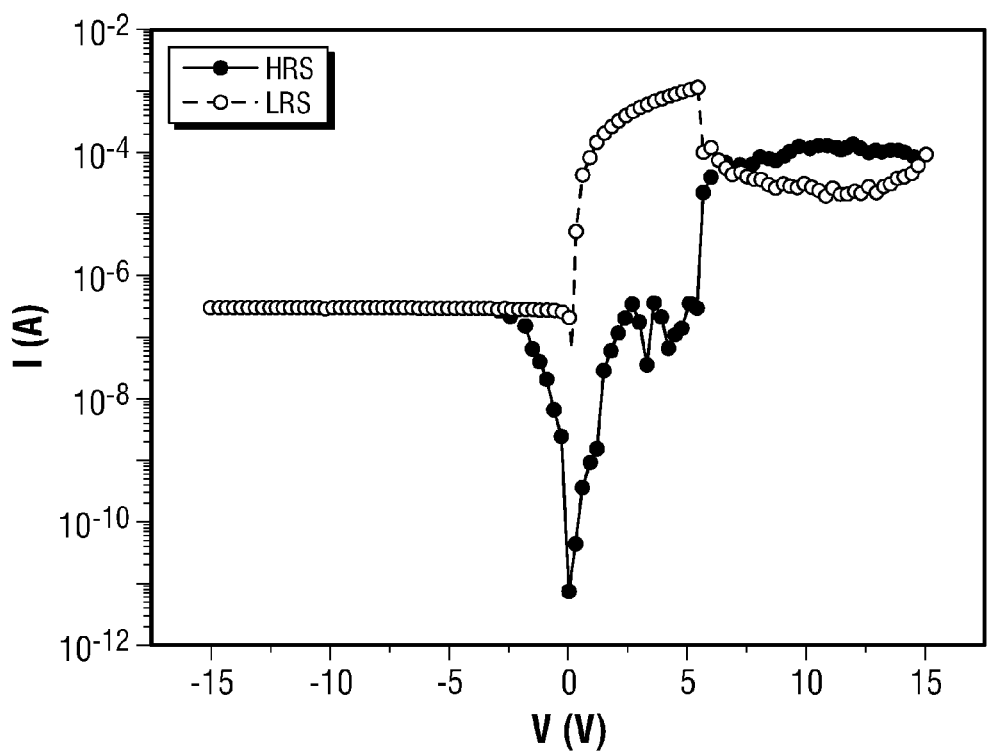
FIGS. 18a and 18b show electric I-V data and the on-off ratio versus voltages for 1D-1R single cell device.
Figure 18B:
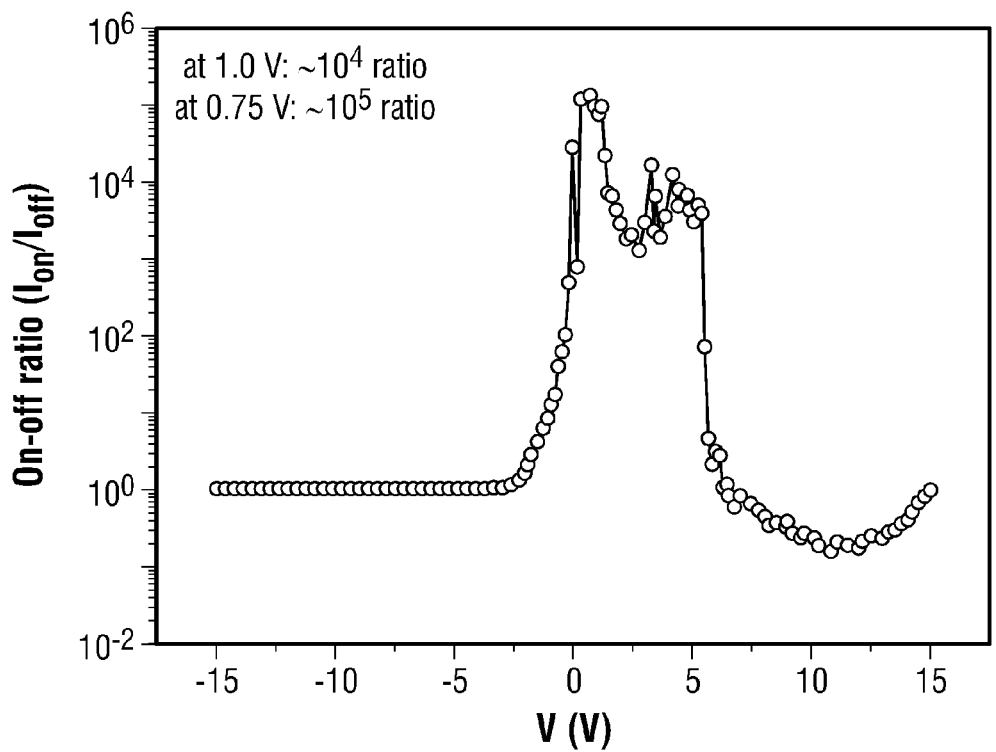

FIG. 17 shows the structure of 1D-1R single cell devices. To form the 1D-1R structure, we deposited the SiO$_x$ and Pd (TE, top electrode) on top of Pd (ME). FIG. 18a shows the result of electrical I-V data of the 1D-1R device testbed structure. In the negative bias region, the Schottky diode naturally suppresses the switching current of memory cell while its switching is only obvious under the positive voltage regime. From this junction structure, one can effectively solve the cross-talk problem in adjacent cells. FIGS. 18a and 18b show electric I-V data and the on-off ratio versus voltages for 1D-1R single cell device. As shown in FIG. 18b, the on-off ratio at 1.0 V is around $10^4$, and highest ratio is around $10^5$ at 0.75 V. These ratios of the 1D-1R device are higher than previously achieved ratios for other 1D-1R devices.

Without further elaboration, it is believed that one skilled in the art can, using the description herein, utilize the present invention to its fullest extent. The embodiments described herein are to be construed as illustrative and not as constraining the remainder of the disclosure in any way whatsoever. While the preferred embodiments have been shown and described, many variations and modifications thereof can be made by one skilled in the art without departing from the spirit and teachings of the invention. Accordingly, the scope of protection is not limited by the description set out above, but is only limited by the claims, including all equivalents of the subject matter of the claims. The disclosures of all patents, patent applications and publications cited herein are hereby incorporated herein by reference, to the extent that they provide procedural or other details consistent with and supplementary to those set forth herein.

What is claimed is:

1. A resistive memory cell comprising:
    a doped silicon layer positioned on a silicon substrate;
    a first electrode;
    a resistive memory material coupled to the first electrode, wherein the resistive memory material is selected from the group consisting of SiO$_x$, SiO$_x$H, SiO$_x$N$_y$, SiO$_x$N$_y$H, SiO$_x$C$_z$, SiO$_x$C$_z$H, and combinations thereof, wherein each of x, y and z are equal to or greater than 1 and equal to or less than 2;
    a diode coupled to the resistive memory material; and
    a second electrode.

2. The resistive memory cell of claim 1, wherein the resistive memory material is positioned on the first electrode.

3. The resistive memory cell of claim 2, wherein the diode is positioned on the resistive memory material.

4. The resistive memory cell of claim 3, wherein the second electrode is positioned on the diode.

5. The resistive memory cell of claim 1, wherein diode is positioned on the first electrode.

6. The resistive memory cell of claim 5, wherein a metallic layer is positioned on the diode.

7. The resistive memory cell of claim 6, wherein the resistive memory material is positioned on the metallic layer.

8. The resistive memory cell of claim 7, wherein the second electrode is positioned on the resistive memory material.

9. The resistive memory cell of claim 1, wherein the first electrode is positioned on the doped silicon layer.

10. The resistive memory cell of claim 9, further comprising a metallic layer positioned on the doped silicon layer.

11. The resistive memory cell of claim 10, wherein the resistive memory material is positioned on the metallic layer.

12. The resistive memory cell of claim 11, wherein the second electrode is positioned on the resistive memory material.

13. The resistive memory cell of claim 1, wherein the diode is selected from the group consisting of n-p diodes, p-n diodes, and Schottky diodes.

14. The resistive memory cell of claim 1, wherein the resistive memory cell is coupled to a plurality of additional resistive memory cells to form a memristor array.

15. The resistive memory cell of claim 1, wherein the resistive memory cell is stacked on another memory cell.

16. A resistive memory array comprising:
a doped silicon layer positioned on a silicon substrate;
a plurality of bit lines, wherein the plurality of bit lines are positioned on the doped silicon layer;
a plurality of word lines;
a plurality of diodes positioned between the word lines and the bit lines; and
a plurality of resistive memory cells coupled to the diodes, wherein the memory cells comprise a resistive memory material, wherein the resistive memory material is selected from the group consisting of $SiO_x$, $SiO_xH$, $SiO_xN_y$, $SiO_xN_yH$, $SiO_xC_z$, $SiO_xC_zH$, and combinations thereof, wherein each of x, y and z are equal to or greater than 1 and equal to or less than 2.

17. The resistive memory array of claim 16, wherein the resistive memory material is positioned on the plurality of bit lines, and the plurality of diodes are positioned on the resistive memory material.

18. The resistive memory array of claim 16, wherein the plurality of diodes are positioned on the bit lines, metallic layers are positioned on the plurality diode, wherein the resistive memory material is positioned on the metallic layers.

19. The resistive memory array of claim 16, further comprising metallic layers positioned on the doped silicon layer, wherein the resistive memory material is positioned on the metallic layers.

20. The resistive memory array of claim 16, wherein the plurality of diodes are selected from the group consisting of n-p diodes, p-n diodes, and Schottky diodes.

21. The resistive memory array of claim 16, wherein the resistive memory array is stacked on another memory array.

* * * * *